ян. 7, 2020

(12) United States Patent
Lee et al.

(10) Patent No.: US 10,529,398 B1
(45) Date of Patent: Jan. 7, 2020

(54) APPARATUSES AND METHODS FOR DUTY CYCLE ERROR CORRECTION OF CLOCK SIGNALS

(71) Applicant: Micron Technology, Inc., Boise, ID (US)

(72) Inventors: Hyun Yoo Lee, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/551,981

(22) Filed: Aug. 27, 2019

Related U.S. Application Data

(63) Continuation of application No. 15/853,514, filed on Dec. 22, 2017, now Pat. No. 10,395,704.

(51) Int. Cl.
| | |
|---|---|
| *G11C 7/22* | (2006.01) |
| *G11C 8/18* | (2006.01) |
| *G11C 16/32* | (2006.01) |
| *G11C 16/28* | (2006.01) |
| *G11C 16/08* | (2006.01) |

(52) U.S. Cl.
CPC ............. *G11C 8/18* (2013.01); *G11C 16/08* (2013.01); *G11C 16/28* (2013.01); *G11C 16/32* (2013.01)

(58) Field of Classification Search
CPC .................................................. G11C 7/22
USPC ............................................. 365/233.11, 191
See application file for complete search history.

(56) References Cited

U.S. PATENT DOCUMENTS

| | | |
|---|---|---|
| 5,689,460 A | 11/1997 | Ooishi |
| 6,396,329 B1 | 5/2002 | Zerbe |
| 6,700,814 B1 | 3/2004 | Nahas et al. |
| 6,870,419 B1 | 3/2005 | Garrett, Jr. et al. |
| 8,189,403 B2 | 5/2012 | Sohn et al. |
| 9,202,561 B1 | 12/2015 | Park et al. |
| 9,449,687 B1 | 9/2016 | Piccardi et al. |
| 10,249,354 B1 | 4/2019 | Lee et al. |

(Continued)

FOREIGN PATENT DOCUMENTS

| | | |
|---|---|---|
| KR | 20030045771 A | 6/2003 |
| KR | 20110003189 A | 1/2011 |
| KR | 20110097838 A | 8/2011 |

OTHER PUBLICATIONS

U.S. Appl. No. 16/274,992, titled "Apparatuses and Methods for Duty Cycle Distortion Correction of Clocks" filed Feb. 13, 2019.

(Continued)

*Primary Examiner* — Jason Lappas
(74) *Attorney, Agent, or Firm* — Dorsey & Whitney LLP

(57) ABSTRACT

Apparatuses and methods for duty cycle error correction of clock signals are disclosed. An example method includes detecting a clock period error between a first clock signal and a third clock signal and adjusting a timing of the first or third clock signals based on the clock period error therebetween. The method further includes detecting a clock period error between a second clock signal and a fourth clock signal and adjusting a timing of the second or fourth clock signals based on the clock period error therebetween. Additionally, the example method includes detecting a duty cycle error between the first, second, third, and fourth clock signals, and adjusting a timing of the first and third or second and fourth clock signals based on the duty cycle error therebetween.

20 Claims, 10 Drawing Sheets

(56) References Cited

U.S. PATENT DOCUMENTS

| | | |
|---|---|---|
| 2003/0221044 A1 | 11/2003 | Nishio et al. |
| 2006/0170453 A1 | 8/2006 | Zerbe et al. |
| 2008/0036509 A1 | 2/2008 | Jang |
| 2008/0159017 A1 | 7/2008 | Kim et al. |
| 2010/0134153 A1 | 6/2010 | Zerbe et al. |
| 2012/0086489 A1 | 4/2012 | Cherkassky et al. |
| 2013/0051114 A1 | 2/2013 | Kim et al. |
| 2015/0222254 A1* | 8/2015 | Walker ............... H03K 5/05 327/175 |
| 2015/0364176 A1 | 12/2015 | Lee |
| 2017/0140726 A1 | 5/2017 | Zhu et al. |

OTHER PUBLICATIONS

International Search Report and Written Opinion for PCT application No. PCT/US2018/005738 dated Apr. 10, 2019, pp. all.

Raja, Immanuel et al., "A 0.1—2-GHz Quadrature Correction Loop for Digital Multiphase Clock Generation Circuits in 130-nm CMOS", IEEE Transactions on Very Large Scale Integration (VLSI) Systems, vol. 25, Issue 3, Mar. 31, 2017, pp. 1-10.

* cited by examiner

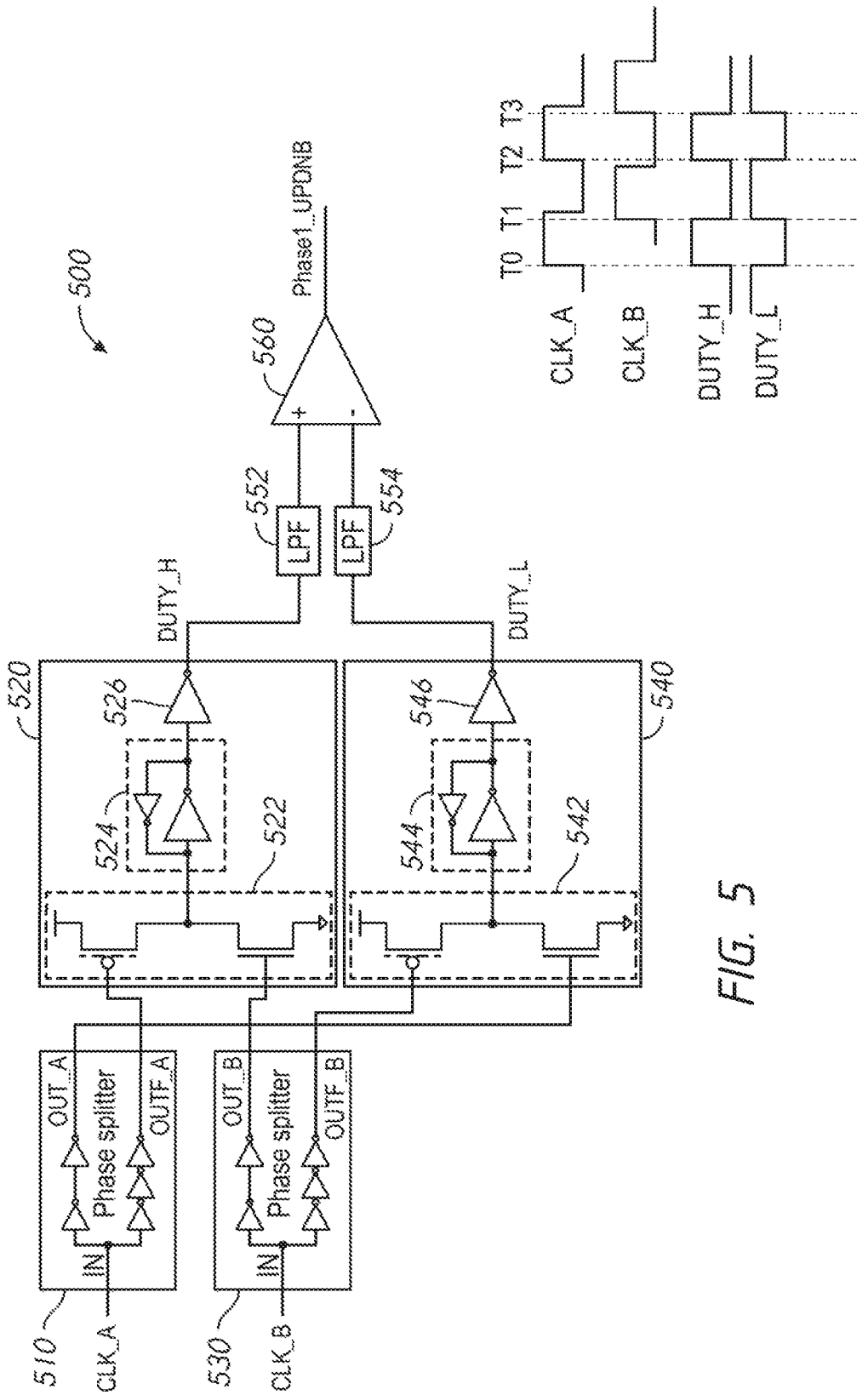

APPARATUSES AND METHODS FOR DUTY CYCLE ERROR CORRECTION OF CLOCK SIGNALS

CROSS-REFERENCE TO RELATED APPLICATION

This application is a divisional of U.S. patent application Ser. No. 15/853,514, filed Dec. 22, 2017. This application is incorporated by reference herein in its entirety and for all purposes.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt by the memory of an associated command. The known timing is typically defined by latency information. The latency information may be defined by numbers of clock cycles of system clock signals CK and CKF.

With newly developed memories, the memories may be provided with system clock signals that are used for timing the command signals and address signals, for example, and further provided with data clock signals that are used for timing the read data provided by the memory and for timing the write data provided to the memory. The memories may also provide clock signals to the controller for timing the provision of data provided to the controller.

The timing of various memory commands provided by the controller and received by the memories may be used to control performance of the memories, including the timing of when clock signals are provided, when data is provided, etc. Limitations on the timing of the various memory commands relative to one another may result in less desirable performance by the memories. As such, it may be desirable to have memory commands with flexible timing to provide desirable memory performance.

BRIEF DESCRIPTION OF THE DRAWINGS

FIG. 5 is a schematic diagram of a detector circuit according to an embodiment of the disclosure.

FIG. 6 is a timing diagram of various signals during operation of the detector circuit of FIG. 5 according to an embodiment of the disclosure.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the disclosure described herein should not be construed to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
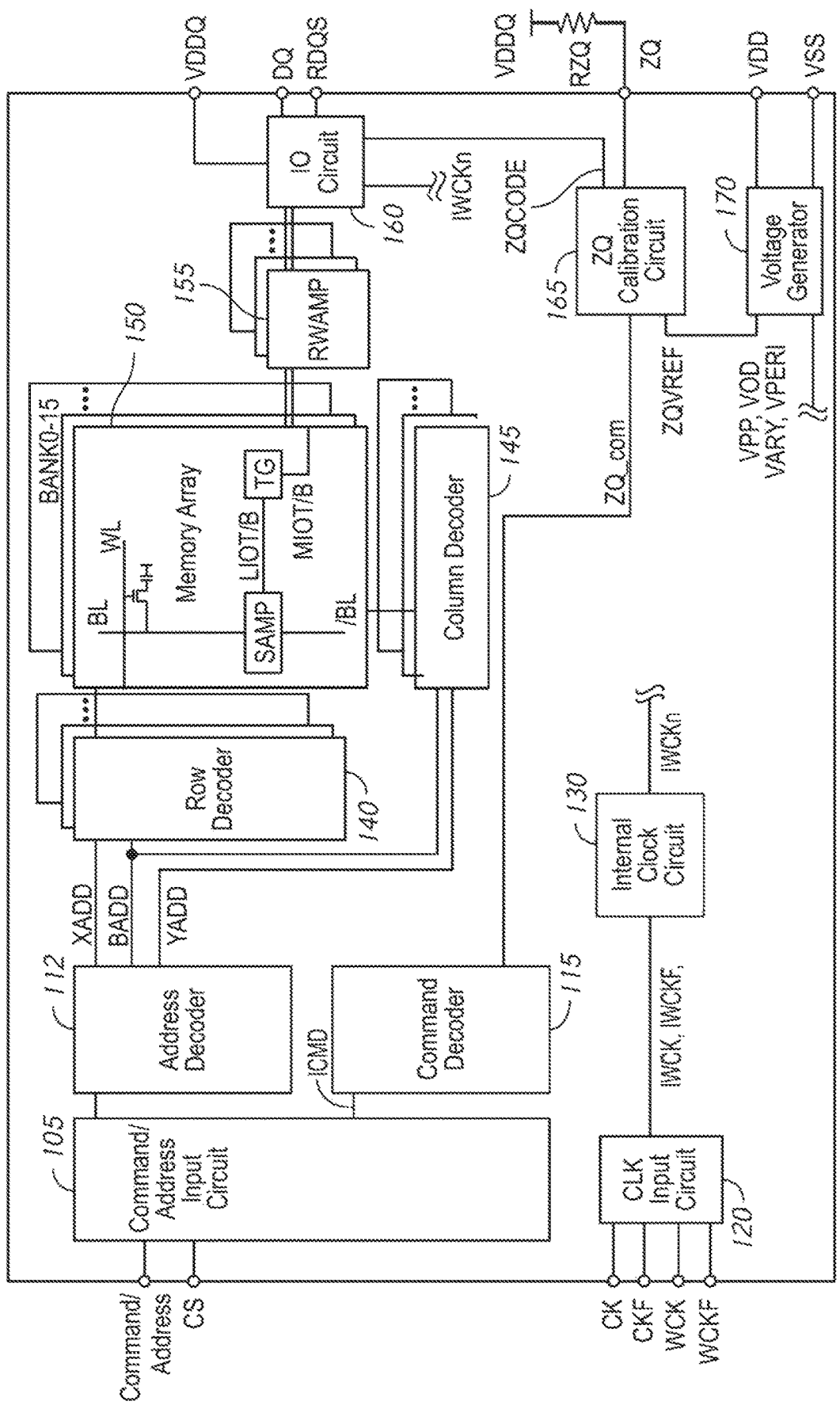
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address terminals coupled to a command and address bus to receive command COMMAND and address ADDRESS, a chip select terminal CS, clock terminals to receive clock signals CK and CKF, data clock terminals to receive data clock signals WCK and WCKF, data terminals DQ and RDQS, power supply terminals VDD, VSS, and VDDQ, and the ZQ calibration terminal (ZQ).

The command and address terminals may be supplied with an address and a bank address, for example, from a memory controller. The address and the bank address supplied to the command and address terminals are transferred, via a command/address input circuit 105, to an address decoder 112. The address decoder 112 receives the address and supplies a decoded row address XADD to the row decoder 140, and a decoded column address YADD to the column decoder 145. The address decoder 112 also receives the bank address and supplies a decoded bank address BADD to the row decoder 140, the column decoder 145.

The command and address terminals may further be supplied with command COMMAND from, for example, a memory controller. The command COMMAND may be provided as internal command signals ICMD to a command decoder 115 via the command/address input circuit 105. The command decoder 115 includes circuits to decode the internal command signals ICMD to generate various internal signals and commands for performing operations. For example, the command decoder 115 may provide a row command signal to select a word line and a column command signal to select a bit line. Another example may be providing internal signals to enable circuits for performing operations, such as control signals to enable signal input buffers that receive clock signals.

When a read command is received and a row address and a column address are timely supplied with the read command, read data is read from a memory cell in the memory array 150 designated by the row address and column address. The read command is received by the command decoder 115, which provides internal commands to input/output circuit 160 so that read data is output to outside from the data terminals DQ via read/write amplifiers 155 and strobe clock signal is provided to outside from the terminals RDQS. The read data is provided at a time following receipt of the read command as defined by read latency information RL that may be programmed in the semiconductor device 100, for example, in a mode register (not shown in FIG. 1). The read latency information RL may be defined in terms of clock cycles of the CK clock signal. For example, the read latency information RL may be a number of clock cycles of the CK signal after the read command is received by the semiconductor device 100 when the associated read data is provided.

When the write command is received and a row address and a column address are timely supplied with this command, then write data is supplied to the data terminals DQ according to the WCK and WCKF clock signals. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address. The write data is provided to the data terminals DQ at a time that is defined by write latency WL information. The write latency WL information may be programmed in the semiconductor device 100, for example, in the mode register (not shown in FIG. 1). The write latency WL information may be defined in terms of clock cycles of the CK clock signal. For example, the write latency information WL may be a number of clock cycles of the CK signal after the write command is received by the semiconductor device 100 when the associated write data is provided.

Turning to an explanation of the external terminals included in the semiconductor device 100, the clock terminals and data clock terminals are supplied with external clock signals. The external clock signals CK, CKF, WCK, WCKF may be supplied to a clock input circuit 120 from a memory controller. The CK and CKF signals are complementary and the WCK and WCKF signals are complementary. For example, rising edges of the CK signal occur at the same time as falling edges of the CKF signal and falling edges of the CK signal occur at the same time as rising edges of the CKF signal. When enabled, input buffers included in the clock input circuit 120 receive the external clock signals. For example, the clock input circuit 120 may receive the external clock signals to generate internal clock signals, including IWCK and IWCKF. The internal clock signals IWCK and IWCKF are supplied to internal clock circuit 130.

The internal clock circuit 130 includes circuits that provide various phase and frequency controlled internal clock signals based on the received internal clock signals. For example, the internal clock circuit 130 may include a data clock path that receives the IWCK and IWCKF clock signals and provides multiphase clock signals IWCKn based on the internal clock signals IWCK and IWCKF. As will be described in more detail below, the multiphase clock signals IWCKn have relative phases with each other and have a phase relationship with the WCK and WCKF clock signals. The multiphase clock signals IWCKn may also be provided to the input/output circuit 160 for controlling an output timing of read data and the input timing of write data. The input/output circuit 160 may include driver circuits for generating and providing the strobe signal from the RDQS terminal to outside such as a memory controller and an application processor.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers SAMP included in the memory array 150, and the internal potential VPERI is used in many other circuit blocks. The reference potential ZQVREF is used in a ZQ calibration circuit 165.

The power supply terminal is also supplied with power supply potential VDDQ. The power supply potential VDDQ is supplied to the input/output circuit 160 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 160 so that power supply noise generated by the input/output circuit 160 does not propagate to the other circuit blocks.

A calibration terminal ZQ is connected to the ZQ calibration circuit 165. The ZQ calibration circuit 165 performs a calibration operation with reference to an impedance of a ZQ calibration resistor RZQ, and the reference potential ZQVREF, when activated by the ZQ calibration command ZQ_com. An impedance code ZQCODE obtained by the calibration operation is supplied to the input/output circuit 160 to set an impedance of an output buffer (not shown) included in the input/output circuit 160.

Figure 2:
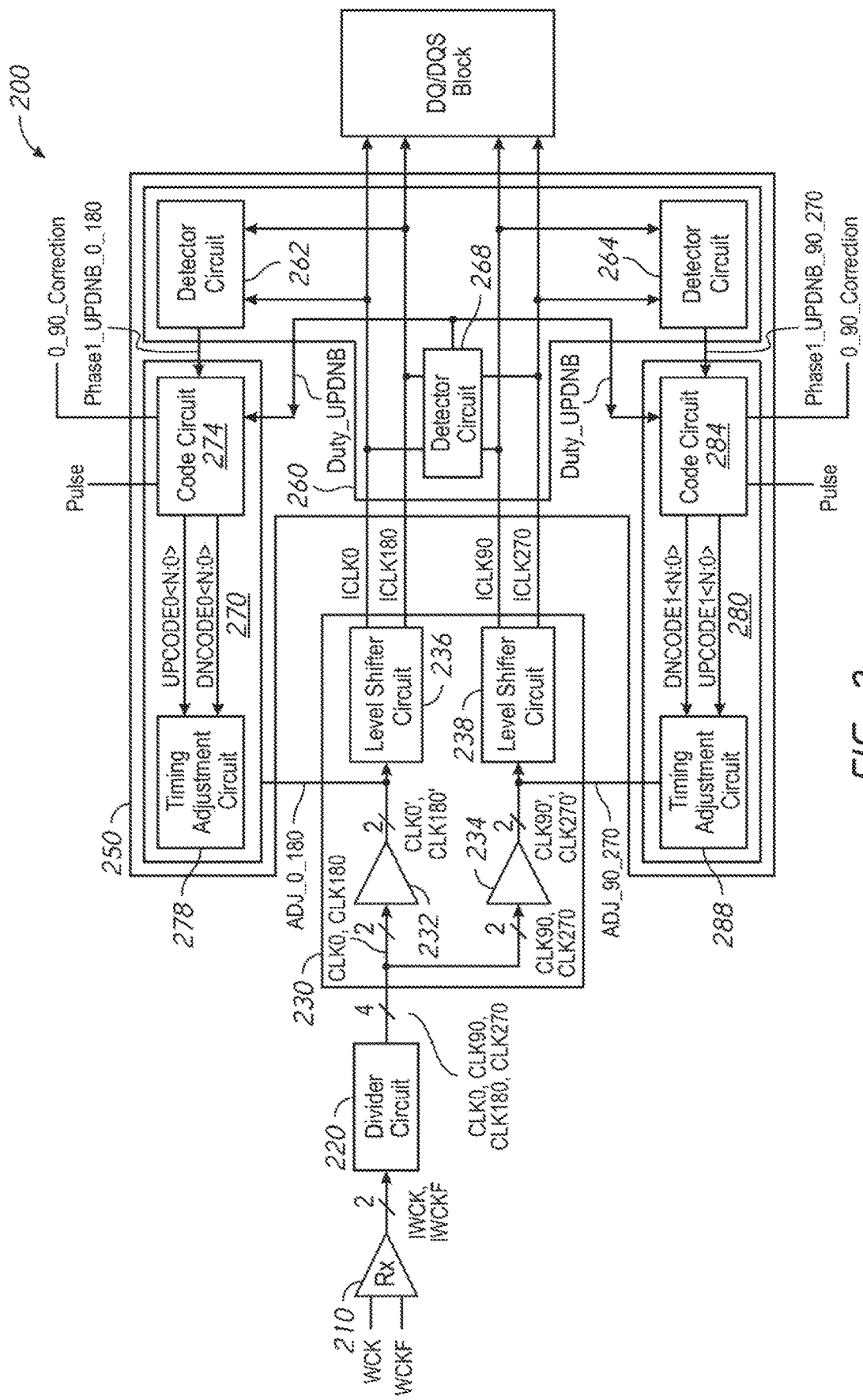
FIG. 2 is a block diagram of a clock circuit according to an embodiment of the disclosure.

FIG. 2 is a block diagram of a clock circuit 200 according to an embodiment of the disclosure. The clock circuit 200 may be included in the internal clock circuit 130 of FIG. 1 in some embodiments of the disclosure.

The clock circuit 200 includes a divider circuit 220 that receives internal clock signals IWCK and IWCKF. The IWCK and IWCKF signals are provided by a receiver circuit 210 that receives data clock signals WCK and WCKF. The WCK and WCKF signals are complementary, as previously discussed. The WCK and WCKF signals may have duty cycle error. The receiver circuit 210 provides internal clock signals IWCK and IWCKF that are based on and have the same clock frequency as the WCK and WCKF signals. The duty cycle error of the WCK and WCKF signals may result in IWCK and IWCKF signals having duty cycle error, as well as other clock signals that may be based on the IWCK and IWCKF signals.

Based on the IWCK and IWCKF signals, the divider circuit 220 provides clock signals CLK0, CLK90, CLK180, and CLK270 which have a lower clock frequency than the IWCK and IWCKF (and WCK and WCKF) signals. The CLK0, CLK90, CLK180, and CLK270 have phase relationships relative to one another, and referred to collectively as multiphase signals. For example, the CLK90 signal is 90 degrees out of phase relative to the CLK0 signal; and the CLK180 signal is 90 degrees out of phase relative to the CLK90 signal; and the CLK270 signal is 90 degrees out of phase relative to the CLK180 signal. In some embodiments of the disclosure, the CLK0, CLK90, CLK180, and CLK270 signals have one-half the clock frequency of the IWCK and IWCKF signals (and also one-half the clock frequency of the WCK and WCKF signals).

The CLK0, CLK90, CLK180, and CLK270 signals are provided to a signal driver circuit 230. The signal driver circuit 230 provides internal signals ICLK0, ICLK90, ICLK180, and ICLK270 based on the CLK0, CLK90, CLK180, and CLK270 signals. The ICLK0, ICLK90, ICLK180, and ICLK270 may be multiphase signals, and have the same relative phase relationship as the CLK0, CLK90, CLK180, and CLK270 signals. In such a case, the ICLK0, ICLK90, ICLK180, and ICLK270 signals (as well as the CLK0, CLK90, CLK180, and CLK270 signals) may be referred to as quadrature clock signals. The signal driver circuit 230 includes repeater circuits 232 and 234, and level shifter circuits 236 and 238. The CLK0 and CLK180 signals are provided to repeater circuit 232 and the CLK90 and CLK270 signals are provided to repeater circuit 234. Each repeater circuit 232 and 234 receives the respective signals and drives the signals to common mode logic (CML) levels. For example, the repeater circuit 232 drives the CLK0 and CLK180 signals to CML levels to provide the signals CLK0' and CLK180', and the repeater circuit 234 drives the CLK90 and CLK270 signals to CML levels to provide the signals CLK90' and CLK270'.

The CLK0' and CLK180' signals are provided to level shifter circuit 236 which changes the levels of the CLK0' and CLK180' signals from CML levels to CMOS levels to provide the internal clock signals ICLK0 and ICLK180. The CLK90' and CLK270' signals are provided to level shifter circuit 238 which changes the levels of the CLK90' and CLK270' signals from CML levels to CMOS levels to provide the internal clock signals ICLK90 and ICLK270. The ICLK0, ICLK90, ICLK80, ICLK270 signals have a clock frequency equal to the CLK0, CLK90, LCK180, and CLK270 signals. CML levels of 0 volts for a low level and 400 mV for a high level, and CMOS levels of 0 volts for a low level and 1.1 volts for a high level may be used in some embodiments of the disclosure. Other voltage and/or current levels may be used for other embodiments of the disclosure, however.

The ICLK0, ICLK90, ICLK180, ICLK270 signals are provided to a duty cycle correction (DCC) circuit 250. The DCC circuit 250 includes a duty cycle detector (DCD) circuit 260, and a duty cycle adjustment (DCA) circuits 270 and 280. In some embodiments of the disclosure the DCA circuits 270 and 280 may be combined into a DCA circuit. The DCC circuit 250 determines clock cycle error (e.g., clock period error, duty cycle error, etc.) of the ICLK0, ICLK90, ICLK180, ICLK270 signals and provides control signal Phase1_UPDNB_0_180 to the DCA circuit 270, provides control signal Phase1_UPDNB_90_270 to the DCA circuit 280, and provides control signals Duty_UPDNB to the DCA circuits 270 and 280. The DCA circuit 270 provides adjustment signals ADJ_0_180 to the signal driver circuit 230 to adjust the timing of the ICLK0 and/or ICLK180 signals based on the Phase1_UPDNB_0_180 signal and the Duty_UPDNB signals. The DCA circuit 280 provides adjustment signals ADJ_90_270 to the signal driver circuit 230 to adjust the timing of the ICLK90 and/or ICLK270 signals based on the Phase1_UPDNB_90_270 signal and the Duty_UPDNB signals.

The ICLK0, ICLK90, ICLK180, and ICLK270 signals are also provided by the clock circuit 200 to circuits included in a DQ/RDQS block. The circuits included in the DQ/RDQS block may include, for example, latch circuits that are clocked by the ICLK0, ICLK90, ICLK180, and ICLK270 signals, driver circuits that are activated by the ICLK0, ICLK90, ICLK180, and ICLK270 signals, and the like. The DQ/RDQS block may be included in an input/output circuit. For example, in some embodiments of the disclosure, the DQ/RDQS block may be included in the input/output circuit 160 of FIG. 1.

The DCD circuit 260 includes a detector 262 that detects a clock period error between the ICLK0 and ICLK180 signals and provides the control signal Phase1_UPDNB_0_180 having a logic level based on the detected clock period error. The DCD circuit 260 also includes a detector 264 that detects a clock period error between the ICLK90 and ICLK270 signals and provides the control signal Phase1_UPDNB_90_270 having a logic level based on the clock period error.

Ideally, rising edges of the ICLK0 signal are halfway between rising edges of the ICLK180 signal (and rising edges of the ICLK180 signal are halfway between rising edges of the ICLK0 signal), and rising edges of the ICLK90 signal are halfway between rising edges of the ICLK270 signal (and rising edges of the ICLK270 signal are halfway between rising edges of the ICLK90 signal). A clock period error between two signals is present when a rising edge of one of the signals is not halfway between rising edges of the other signal. For example, a clock period error between the ICLK0 and ICLK180 signals is present when a rising edge of the ICLK0 signal is not halfway between rising edges of the ICLK180 signal. In such a case, a rising edge of the ICLK180 signal is also not halfway between rising edges of the ICLK0 signal. Similarly, a clock period error between the ICLK90 and ICLK270 signals is present when a rising edge of the ICLK90 signal is not halfway between rising edges of the ICLK270 signal (in which case a rising edge of the ICLK270 signal is also not halfway between rising edges of the ICLK90 signal).

The detector 262 provides the Phase1_UPDNB_0_180 signal having a low logic level when a rising edge of the ICLK0 signal is more than halfway between rising edges of the ICLK180 signal (i.e., a rising edge of the ICLK0 signal lags (later than) halfway between rising edges of the ICLK180 signal). Conversely, the detector 262 provides the Phase1_UPDNB_0_180 signal having a high logic level when a rising edge of the ICLK0 signal is less than halfway between rising edges of the ICLK80 signal (i.e., a rising edge of the ICLK90 signal leads (earlier than) halfway between rising edges of the ICLK270 signal). The detector 264 operates similarly to the detector 262, with the detector 264 providing the Phase1_UPDNB_90_270 signal having a low logic level when a rising edge of the ICLK90 signal is more than halfway between rising edges of the ICLK270 signal (i.e., a rising edge of the ICLK0 signal lags (later than) halfway between rising edges of the ICLK180 signal). Conversely, the detector 264 provides the Phase1_UPDNB_90_270 signal having a high logic level when a rising edge of the ICLK90 signal is less than halfway between rising edges of the ICLK270 signal (i.e., a rising edge of the ICLK90 signal leads (earlier than) halfway between rising edges of the ICLK270 signal).

The DCD circuit 260 further includes a detector 268 that detects a duty cycle error between the ICLK0, ICLK90, ICLK180, and ICLK270 signals. Ideally, when clock period error is not present between the ICLK0 and ICLK180 signals and clock period error is not present between the ICLK90 and ICLK270 signals, rising edges of the ICLK90 signal are halfway between rising edges of the ICLK0 signal and following rising edges of the ICLK180 signal, and rising edges of the ICLK270 signal are halfway between rising edges of the ICLK180 signal and following rising edges of the ICLK0 signal. In such an ideal case, rising edges of the ICLK0 signal are halfway between rising edges of the ICLK270 signal and following rising edges of the ICLK90 signal, and rising edges of the ICLK180 signal are halfway between rising edges of the ICLK90 signal and following rising edges of the ICLK270 signal. A duty cycle error is present for the ICLK0, ICLK90, ICLK180, and ICLK270 signals when the any of the rising edges deviate from the ideal case previously described.

The detector 268 provides a control signal Duty_UPDNB having a logic level based on detection of duty cycle error for the ICLK0, ICLK90, ICLK180, and ICLK270 signals. For example, the detector 268 provides a Duty_UPDNB signal having a low logic level when rising edges of the ICLK90 signal lead (earlier than) halfway between rising edges of the ICLK0 and following rising edges of the ICLK180 signals. In such a case, rising edges of the ICLK270 signal also lead (earlier than) halfway between rising edges of the ICLK180 and following rising edges of the ICLK0 signals. The detector 268 provides a Duty_UPDNB signal having a high logic level when rising edges of the ICLK90 signal lag (later than) halfway between rising edges of the ICLK0 and following rising edges of the ICLK180 signals. In such a case, rising edges of the ICLK270 signal also lag (later than) halfway between rising edges of the ICLK80 and following rising edges of the ICLK0 signals.

The DCA circuit 270 includes a code circuit 274 and a timing adjustment circuit 278. The code circuit 274 receives the Phase1_UPDNB_0_180 signal from the detector circuit 262 and the Duty_UPDNB signal from the detector circuit 268. The code circuit 274 further receives a control signal 0_90_Correction and a control signal Pulse that control operation of the code circuit 274. The code circuit 274 provides code signals UPCODE0<N:0> and DNCODE0<N:0> based on the Phase1_UPDNB_0_180 signal and on the Duty_UPDNB signal when in operation. The UPCODE0<N:0> signals may include one or more signals and the DNCODE0<N:0> signals may include one or more signals, for example, the UPCODE0<N:0> and DNCODE0<N:0> signals may include N+1 signals, where N is a whole number.

The UPCODE0<N:0> and DNCODE0<N:0> signals are provided to the timing adjustment circuit 278 which provides the ADJ_0_180 signals to the signal driver circuit 230 to adjust the timing of the CLK0' and CLK180' signals (which in turn adjust the timing of the ICLK0 and ICLK180 signals). In some embodiments of the disclosure, the timing adjustment circuit 278 provides ADJ_0_180 signals that adjust the timing of the CLK0' and CLK180' signals by adjusting the timing of signal transitions (e.g., rising edges and falling edges) of the CLK0' and CLK180' signal. In particular, signal transitions may be adjusted to be faster (e.g., change more quickly between levels) to decrease delay or adjusted to be slower (e.g., change more slowly between levels) to increase delay.

The DCA circuit 280 includes a code circuit 284 and a timing adjustment circuit 288. The code circuit 284 receives the Phase1_UPDNB_90_270 signal from the detector circuit 264 and the Duty_UPDNB signal from the detector circuit 268. The code circuit 284 further receives a control signal 0_90_Correction and the Pulse signal that control operation of the code circuit 284. The code circuit 284 provides code signals UPCODE1<N:0> and DNCODE1<N:0> based on the Phase1_UPDNB_90_270 signal and on the Duty_UPDNB signal when in operation. The UPCODE1<N:0> signals may include one or more signals and the DNCODE1<N:0> signals may include one or more signals, for example, the UPCODE1<N:0> and DNCODE1<N:0> signals may include N+1 signals, where N is a whole number.

The UPCODE1<N:0> and DNCODE1<N:0> signals are provided to the timing adjustment circuit 288 which provides the ADJ_90_270 signals to the signal driver circuit 230 to adjust the timing of the CLK90' and CLK270' signals (which in turn adjust the timing of the ICLK90 and ICLK270 signals). In some embodiments of the disclosure, the timing adjustment circuit 288 provides ADJ_90_270 signals that adjust the timing of the CLK90' and CLK270' signals by adjusting the timing of signal transitions (e.g., rising edges and falling edges) of the CLK90' and CLK270' signal. In particular, signal transitions may be adjusted to be faster (e.g., change more quickly between levels) to decrease delay or adjusted to be slower (e.g., change more slowly between levels) to increase delay.

In some embodiments of the disclosure, the timing of the CLK0', CLK90', CLK180', and CLK270' signals are adjusted by increasing delay to any of the signals. In some embodiments of the disclosure, the timing of the CLK0', CLK90', CLK180', and CLK270' signals are adjusted by decreasing delay to any of the signals. In some embodiments of the disclosure, the timing of the CLK0', CLK90', CLK180', and CLK270' signals are adjusted by either increasing or decreasing delay to any of the signals. Adjusting the timing of the signals by increasing delay of any of the signals may reduce power consumption and clock jitter by using active circuits when delay is increased, in contrast to deactivating already activated circuits to decrease delay.

Figure 3:
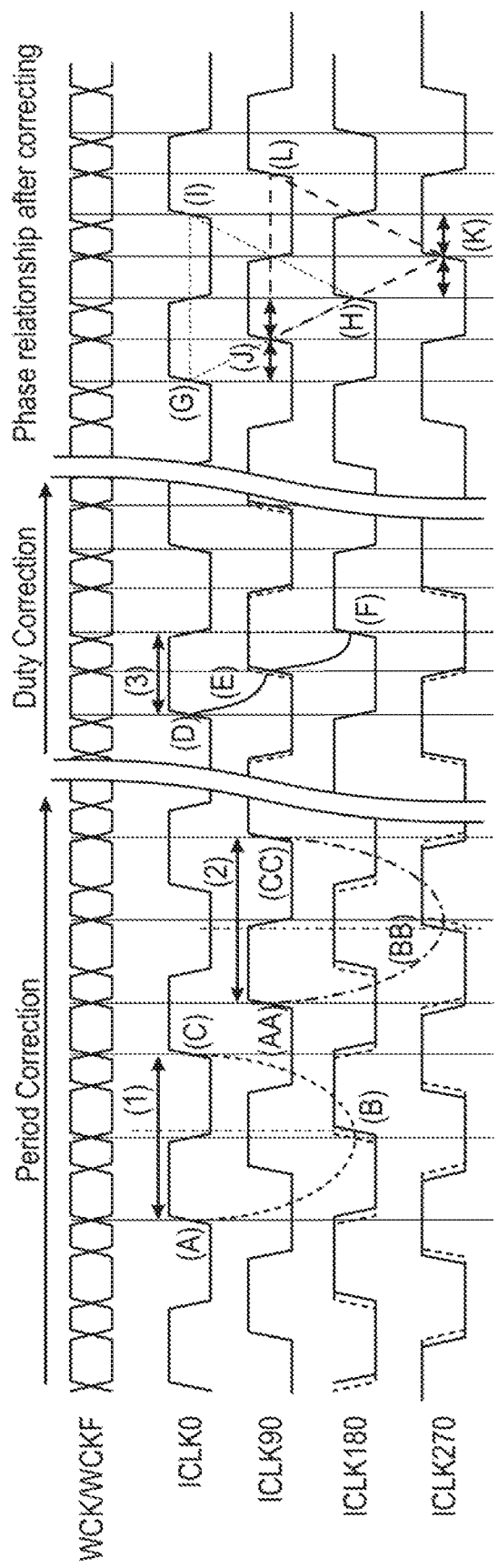
FIG. 3 is a timing diagram of various signals during operation of the clock circuit of FIG. 2 according to an embodiment of the disclosure.

Operation of the clock circuit 200 will be described with reference to FIGS. 2 and 3. FIG. 3 is a timing diagram of various signals during operation of the clock circuit 200 according to an embodiment of the disclosure. FIG. 3 shows the data clock signals WCK and WCKF, and the ICLK0, ICLK90, ICLK180, and ICLK270 signals provided by the signal driver circuit 230 resulting from the WCK and WCKF signals.

As shown in FIG. 3, the WCK and WCKF signals have a duty cycle error, in particular the WCK signal has a duty cycle greater than 50% and the WCKF signal has a duty cycle less than 50%. However, it will be assumed for the present example that the clock period of the WCK and WCKF signals (as well as the duty cycle error of the WCK and WCKF signals) is consistent over time. As a result, the period of the ICLK0, ICLK90, ICLK180, and ICLK270 signals are also consistent over time. That is, the periods of the ICLK0, ICLK90, ICLK180, and ICLK270 signals are the same and do not vary. In addition to clock cycle error from the duty cycle error of the WCK and WCKF signals, the ICLK0, ICLK90, ICLK180, and ICLK270 signals, may have timing skew relative to one another due to mismatches in the circuits that provide the ICLK0, ICLK90, ICLK180, and ICLK270 signals. For example, the ICLK0 signal and the ICLK180 signal may be skewed relative to one another from being 180 degrees out of phase, and the ICLK90 signal and ICLK270 signal may be skewed relative to one another from being 180 degrees out of phase. Additionally, the ICLK0 and ICLK90 (and the ICLK180 and ICLK270) signals may be skewed relative to one another from being 90 degrees out of phase.

As previously described, no clock period error is present for ICLK0 and ICLK180 signals when rising edges of the ICLK0 signal are halfway between rising edges of the ICLK180 signal (and rising edges of the ICLK180 signal are halfway between rising edges of the ICLK0 signal). Understanding that the periods of the WCK and WCKF signals are consistent, and the periods of the ICLK0, ICLK90, ICLK180, and ICLK270 signals are consistent, with reference to FIG. 3, the time from rising edge (A) of the ICLK0 signal to rising edge (B) of the ICLK180 signal should be equal to the time from the rising edge (B) of the ICLK180 signal to rising edge (C) of the ICLK0 signal. The ideal timing for the ICLK180 signal is shown in FIG. 3 in dashed line for the ICLK180 signal. However, in the present example, the actual ICLK180 signal is lagging (later than) the ideal timing for the ICLK180 signal, as shown in FIG. 3 as the solid line for the ICLK180 signal. Thus, for the solid line ICLK180 signal, the time between (A) to (B) is greater than the time between (B) to (C). The time between (A) to (B) should be decreased to provide the ideal clock period timing between ICLK0 and ICLK180 signals.

The detector circuit 262 detects the clock period error between the ICLK0 and ICLK180 signals and provides the Phase1_UPDNB_0_180 signal reflecting the error. The Phase1_UPDNB_0_180 signal is provided by the detector circuit 262 to the code circuit 274, which when activated by an inactive 0_90_signal (e.g., inactive low level) and active Pulse signal (e.g., active high logic level), provides UPCODE0<N:0> and DNCODE0<N:0> signals to the timing adjustment circuit 278 that are based on the Phase1_UPDNB_0_180 signal. The timing adjustment circuit 278 uses the UPCODE0<N:0> and DNCODE0<N:0> signals to provide the ADJ_0_180 signals to the signal driver circuit 230 to add delay to the CLK0' signal, which in turn, causes the ICLK0 signal to be delayed relative to the ICLK180 signal. When sufficient delay is added to the ICLK0 signal, as determined by the detect circuit 262, the time between (A) to (B) becomes equal to the time between (B) to (C), and the rising edge (B) of ICLK180 signal is halfway between the rising edges (A) and (C) of ICLK0 signal. With the periods of the ICLK0 signal and ICLK180 signal being consistent and the same, rising edges of ICLK180 signal are halfway between rising edges of ICLK0 signal.

As applied to the ICLK90 and ICLK270 signals, the time from rising edge (AA) of the ICLK90 signal to rising edge (BB) of the ICLK270 signal should be equal to the time from the rising edge (BB) of the ICLK270 signal to rising edge (CC) of the ICLK90 signal. The ideal timing for the ICLK270 signal is shown in FIG. 3 in dashed line for the ICLK270 signal. However, in the present example, the actual ICLK270 signal is leading (earlier than) the ideal timing for the ICLK270 signal, as shown in FIG. 3 as the solid line for the ICLK270 signal. Thus, for the solid line ICLK270 signal, the time between (AA) to (BB) is less than the time between (BB) to (CC). The time between (AA) to (BB) should be increased to provide the ideal clock period timing between ICLK90 and ICLK270 signals.

The detector circuit 264 detects the clock period error between the ICLK90 and ICLK270 signals and provides the Phase1_UPDNB_90_270 signal reflecting the error. The Phase1_UPDNB_90_270 signal is provided by the detector circuit 264 to the code circuit 284, which when activated by an inactive 0_90_signal (e.g., inactive low level) and active Pulse signal (e.g., active high logic level), provides UPCODE1<N:0> and DNCODE1<N:0> signals to the timing adjustment circuit 288 that are based on the Phase1_UPDNB_90_270 signal. The timing adjustment circuit 288 uses the UPCODE1<N:0> and DNCODE1<N:0> signals to provide the ADJ_90_270 signals to the signal driver circuit 230 to add delay to the CLK270' signal, which in turn, causes the ICLK270 signal to be delayed relative to the ICLK90 signal. When sufficient delay is added to the ICLK270 signal, as determined by the detect circuit 264, the time between (AA) to (BB) becomes equal to the time between (BB) to (CC), and the rising edge (BB) of ICLK270 signal is halfway between the rising edges (AA) and (CC) of ICLK90 signal. With the periods of the ICLK90 signal and ICLK270 signal being consistent and the same, the rising edges of ICLK270 signal are halfway between rising edges of ICLK90 signal.

The clock period error between the ICLK0 and ICLK180 signals and between the ICLK90 and ICLK270 signals may detected and corrected concurrently in some embodiments of the disclosure. For example, both the code circuits 274 and 284 may be activated concurrently to provide the ADJ_0_180 signals and ADJ_90_270 signals to the signal driver circuit 230 to adjust the timing of the ICLK0 and/or ICLK180 signals, and the ICLK90 and/or ICLK270 signals. In other embodiments of the disclosure, the clock period error between the ICLK0 and ICLK180 signals and between the ICLK90 and ICLK270 signals may be detected and corrected sequentially, overlapping, etc.

Following the timing adjustment of the ICLK0 and/or ICLK180 signals and the timing adjustment of the ICLK90 and/or ICLK270 to remove clock period error, a duty cycle error between the ICLK0, ICLK90, ICLK180, and ICLK270 signals is detected and corrected.

As previously described, assuming that no clock period error is present between ICLK0 and ICLK180 and between ICLK90 and ICLK270, no duty cycle error is present for the ICLK0, ICLK90, ICLK180, and ICLK270 signals when rising edges of the ICLK90 signal are halfway between rising edges of the ICLK0 signal and following rising edges of the ICLK180 signal, and rising edges of the ICLK270 signal are halfway between rising edges of the ICLK180 signal and following rising edges of the ICLK0 signal. With reference to FIG. 3, the time from rising edge (D) of the ICLK0 signal to rising edge (E) of the ICLK90 signal should be equal to the time from rising edge (E) of the ICLK90 signal to rising edge (F) of the ICLK180 signal. By adjusting the timing of the ICLK signals in pairs (e.g., adjusting the timing of both the ICLK0 and ICLK180 signals; adjusting the timing of both the ICLK90 and ICLK270 signals), the alignment of the rising edge (E) of the ICLK90 signal halfway between rising edges (D) and (F) also results in the alignment of rising edges of the ICLK270 signal between rising edge (F) and a following rising edge of the ICLK0 signal.

As previously described, the ICLK0 signal was adjusted from an initial timing to have greater delay in order to remove clock period error between the ICLK0 and ICLK180 signals, and the ICLK270 signal was adjusted from an initial timing to have greater delay in order to remove clock period error between the ICLK90 and ICLK270 signals. As shown in FIG. 3, even with the additional delay to the ICLK0 signal, the time between (D) to (E) is greater than the time between (E) to (F). The time between (D) to (E) should be decreased (and the time (E) to (F) increased) to provide the ideal duty cycle timing between the ICLK0, ICLK90, ICLK180, and ICLK270 signals (e.g., no duty cycle error present).

The detector 268 detects the duty cycle error between the ICLK0, ICLK90, ICLK180, and ICLK270 signals and provides the Duty_UPDNB signal reflecting the error. The Duty_UPDNB signal is provided by the detector circuit 268 to the code circuit 274 and the code circuit 284. When activated by an active 0_90_signal (e.g., active high level) and active Pulse signal (e.g., active high logic level), the code circuits 274 and 284 provide UPCODE0<N:0> and DNCODE0<N:0> signals and UPCODE1<N:0> and DNCODE1<N:0> signals to the timing adjustment circuit 278 and to the timing adjustment circuit 288, respectively, that are based on the Duty_UPDNB signal. The timing adjustment circuit 278 uses the UPCODE0<N:0> and DNCODE0<N:0> signals to provide the ADJ_0_180 signals to the signal driver circuit 230 and the timing adjustment circuit 288 uses the UPCODE1<N:0> and DNCODE1<N:0> signals to provide the ADJ_90_270 signals to the signal driver circuit 230 to adjust one or more of the ICLK0, ICLK90, ICLK180, ICLK270 signals to correct duty cycle error.

In the present example where the time between (D) to (E) is greater than the time between (E) to (F), and the time between (D) to (E) should be decreased (and the time (E) to (F) increased) to remove duty cycle error, the timing adjustment circuits 278 and 288 provide the ADJ_0_180 signals and the ADJ_90_270 signals to add delay to the ICLK0 and ICLK180 signals. As a result, the ICLK0 and ICLK180 signals are delayed to decrease the time between (D) to (E) and increase the time between (E) to (F).

When sufficient delay is added to the ICLK0 and ICLK180 signals, as determined by the detect circuit 268, the time between (D) to (E) becomes equal to the time between (E) to (F), and the rising edge (E) of ICLK90 signal is halfway between the rising edges (D) of the CLK0 signal and (F) of the ICLK180 signal. With the clock period error already corrected between the ICLK90 signal and the ICLK270 signal, rising edges of the ICLK270 signal are halfway between rising edges of the ICLK180 signal and following rising edges of the ICLK0 signal.

Following the duty cycle correction, rising edges of the IICLK0, ICLK90, ICLK180, and ICLK270 signals are aligned with the proper phases of 0 degree, 90 degrees, 180 degrees, and 270 degrees over one clock cycle of the ICLK signals. With reference to FIG. 3, rising edge (H) of the ICLK180 signal is halfway between rising edges (G) and (I) of the ICLK0 signal and rising edge (K) of the ICLK270 signal is halfway between rising edges (J) and (L) of the ICLK90 signal. Additionally, rising edge (J) of the ICLK90 signal is halfway between the rising edges (G) of the ICLK0 signal and (H) of the ICLK180 signal, and rising edge (K) of the ICLK270 signal is halfway between the rising edges (H) of the ICLK180 signal and (I) of the ICLK0 signal.

Figure 4:
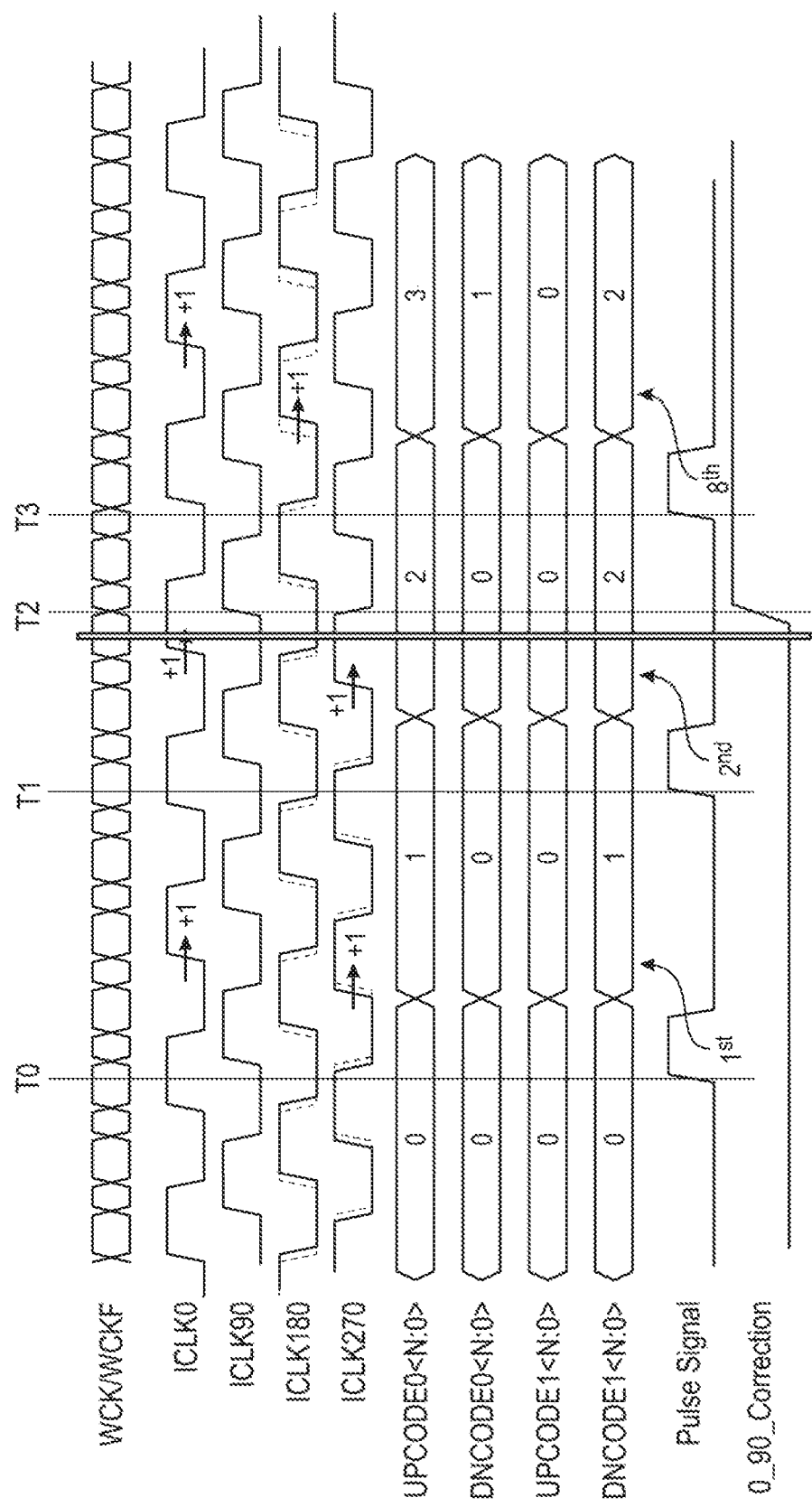
FIG. 4 is a timing diagram of various signals during operation of the clock circuit of FIG. 2 according to an embodiment of the disclosure.

FIG. 4 is a timing diagram of various signals during operation of the clock circuit 200 according to an embodiment of the disclosure. FIG. 4 illustrates the UPCODE0<N:0> and DNCODE0<N:0> signals provided by the code circuit 274 and the UPCODE0<N:0> and DNCODE0<N:0> signals provided by the code circuit 284 for the example of FIG. 3. Further illustrated are the Pulse signal and the 0_90_Correction signal.

FIG. 4 illustrates adding delay to the ICLK0 signal to remove clock period error between the ICLK0 and ICLK180 signals, and adding delay to the ICLK270 signal to remove clock period error between the ICLK90 and ICLK270 signals. As previously described with reference to FIG. 3, the detector circuit 262 detects a clock period error between the ICLK0 and ICLK180 signals and provides a Phase1_UPDNB_0_180 signal indicating the clock period error to the code circuit 274. Similarly, the detector circuit 264 detects a clock period error between the ICLK90 and ICLK270 signals and provides a Phase1_UPDNB_90_270 signal indicating the clock period error to the code circuit 284.

At time T0, the 0_90_Correction signal is at a low level indicating that clock period adjustment is performed. The low level 0_90_Correction signal controls the code circuits 274 and 284 to receive the Phase1_UPDNB_0_180 signal and Phase1_UPDNB_90_270 signal, respectively, when the Pulse signal pulses to a high level. Based on the Phase1_UPDNB_0_180 signal, the code circuit 274 provides to the timing adjustment circuit 278 an UPCODE0<N:0> signal to add delay to the ICLK0 signal and a DNCODE0<N:0> signal to not add delay to the ICLK180 signal. Based on the Phase1_UPDNB_90_270 signal, the code circuit 284 provides to the timing adjustment circuit 288 an UPCODE1<N:0> signal to not add delay to the ICLK90 signal and a DNCODE1<N:0> signal to add delay to the ICLK270 signal. The values of UPCODE0<N:0>, DNCODE0<N:0>, UPCODE1<N:0>, and DNCODE1<N:0> are represented by 1, 0, 0, 1, respectively, following time T0 in FIG. 4.

In the present example, the detector circuit 262 continues to detect a clock period error between the ICLK0 and ICLK180 signals even after the timing adjustment of the ICLK0 signal and provides a Phase1_UPDNB_0_180 signal indicating the clock period error to the code circuit 274. The detector circuit 264 also continues to detect a clock period error between the ICLK90 and ICLK270 signals and provides a Phase1_UPDNB_90_270 signal indicating the clock period error to the code circuit 284.

At time T1, the Pulse signal pulses to a high level, causing the code circuit 274 to receive the Phase1_UPDNB_0_180 signal. Based on the Phase1_UPDNB_0_180 signal, the code circuit 274 provides to the timing adjustment circuit 278 an UPCODE0<N:0> signal to add delay to the ICLK0 signal and a DNCODE0<N:0> signal to not add delay to the ICLK180 signal. The Pulse signal also causes the code circuit 284 to receive the Phase1_UPDNB_90_270 signal. Based on the Phase1_UPDNB_90_270 signal, the code circuit 284 provides to the timing adjustment circuit 288 an UPCODE1<N:0> signal to not add delay to the ICLK90 signal and a DNCODE1<N:0> signal to add delay to the ICLK270 signal. The values of UPCODE0<N:0>, DNCODE0<N:0>, UPCODE1<N:0>, and DNCODE1<N:0> are represented by 2, 0, 0, 2, respectively, following time T1 in FIG. 4.

After the second adjustment to the ICLK0 and ICLK270 signals, the detector circuits 262 and 264 do not detect the presence of any clock period errors between the ICLK0 and ICLK08 signals, and between the ICLK90 and ICLK270 signals.

At time T2, the 0_90_Correction signal changes to a high level, causing the code circuits 274 and 284 to receive the Duty_UPDNB signal from the detector circuit 268 when the Pulse signal pulses. As previously described, the Duty_UPDNB signal is indicative of duty cycle error between the ICLK0, ICLK90, ICLK180, and ICLK270 signals.

As previously described with reference to FIG. 3, the detector circuit 268 detects a duty cycle error between the ICLK0, ICLK90, ICLK180, and ICLK270 signals and provides a Duty_UPDNB indicating a duty cycle error where rising edges of the ICLK90 and ICLK270 signals are lagging from halfway between rising edges of the ICLK0 and ICLK180 signals (or, from another perspective, rising edges of the ICLK0 and ICLK180 signals are leading from halfway between rising edges of the ICLK90 and ICLK270 signals).

At time T3, the Pulse signal pulses high and causes the code circuit 274 to receive the Duty_UPDNB signal from the detector circuit 268 and provide UPCODE0<N:0> and DNCODE0<N:0> signals to the timing adjustment circuit 278 to add delay to the ICLK0 and ICLK180 signals. The Pulse signal also causes the code circuit 284 to receive the Duty_UPDNB signal from the detector circuit 268 and provide UPCODE1<N:0> and DNCODE1<N:0> signals to the timing adjustment circuit 288 to not add delay to the ICLK90 and ICLK270 signals. Following the timing adjustment from the Pulse signal at time T3, the values of UPCODE0<N:0>, DNCODE0<N:0>, UPCODE1<N:0>, and DNCODE1<N:0> are represented by 3, 1, 0, 2, respectively, in FIG. 4.

FIG. 5 is a schematic diagram of a detector circuit 500 according to an embodiment of the disclosure. The detector circuit 500 may be included in the detector circuit 262 and/or detector circuit 264 of FIG. 2 in some embodiments of the disclosure.

The detector circuit 500 includes phase splitter circuits 510 and 530. Each phase splitter circuit receives a respective input signal and provides two output signals. In particular, the phase splitter circuit 510 receives a CLK_A signal and provides output signals OUT_A and OUTF_A, and the phase splitter circuit 530 receives a CLK_B signal and provides output signals OUT_B and OUTF_B. The output signal OUT has the same signal level as the input signal CLK and the output signal OUTF has the complementary signal level to the input signal CLK. For example, when the input signal CLK has a high level, the OUT signal has a high level and the OUTF signal has a low level; and when the input signal CLK has a low level, the OUT signal has a low level and the OUTF signal has a high level. Each phase splitter includes first and second signal paths. The first signal path includes two series-coupled inverter circuits and provides the OUT signal and the second signal path includes three series-coupled inverter circuits and provides the OUTF signal.

The detector circuit 500 further includes a phase detect circuit 520 and a phase detect circuit 540. The phase detect circuit 520 is provided with the OUTF_A and OUT_B signals and provides an output signal DUTY_H indicative of a phase relationship between the CLK_A and CLK_B signals. The phase detect circuit 540 is provided with the OUT_A and OUTF_B signals and provides an output signal DUTY_L that is the complement of the DUTY_H signal.

The phase detect circuit 520 includes an inverter 522 having a pull-up transistor controlled by the OUTF_A signal and a pull-down transistor controlled by the OUT_B signal. An output of the inverter circuit 522 is coupled to a latch circuit 524. The latch circuit 524 is a weak latch that holds a logic level of the inverter circuit 522 when the pull-up and pull-down transistors are not active (e.g., not conductive). An output of the latch circuit 524 is coupled to an inverter circuit 526, which provides the DUTY_H signal. The phase detect circuit 540 includes an inverter 542 having a pull-up transistor controlled by the OUTF_B signal and a pull-down transistor controlled by the OUT_A signal. An output of the inverter circuit 542 is coupled to a latch circuit 544. The latch circuit 544 is a weak latch that holds a logic level of the inverter circuit 542 when the pull-up and pull-down transistors are not active (e.g., not conductive). An output of the latch circuit 544 is coupled to an inverter circuit 546, which provides the DUTY_L signal.

The DUTY_H signal is provided to a filter circuit 552 and the DUTY_L signal is provided to a filter circuit 554. The filter circuits 552 and 554 filter high-frequency changes of the DUTY_H and DUTY_L signals, respectively. The filtered DUTY_H and DUTY_L signals are provided to an amplifier circuit 560 that provides an output signal Phase1_UPDNB based on the levels of the filtered DUTY_H and DUTY_L signals.

In embodiments of the disclosure where the detector circuit 500 is included in the detector circuit 262, the CLK_A signal may be the ICLK0 signal and the CLK_B signal may be the ICLK180 signal, and the Phase1_UPDNB signal may be the Phase1_UPDNB_0_180 signal. In embodiments of the disclosure where the detector circuit 500 is included in the detector circuit 264, the CLK_A signal may be the ICLK90 signal and the CLK_B signal may be the ICLK270 signal, and the Phase1_UPDNB signal may be the Phase1_UPDNB_90_270 signal.

Operation of the detector circuit 500 will be described with reference to FIG. 6. FIG. 6 is a timing diagram of various signals during operation of the detector circuit 500 according to an embodiment of the disclosure.

In operation, rising edges of the CLK_A signal cause the DUTY_H signal to change to a high level and cause the DUTY_L signal to change to a low level, and rising edges of the CLK_B signal cause the DUTY_H signal to change to a low level and cause the DUTY_L signal to change to a high level. With reference to FIG. 6, at time T0, the rising edge of the CLK_A signal causes the DUTY_H signal to change to a high level and the DUTY_L signal to change to a low level. At time T1, the rising edge of the CLK_B signal causes the DUTY_H signal to change to a low level and the DUTY_L signal to change to a high level. The cycle of changing levels of the DUTY_H and DUTY_L signals is repeated at times T2 and T3.

The filter circuits 552 and 554 essentially remove changes in the levels for the DUTY_H and DUTY_L signals that are less than half the cycle of the DUTY_H and DUTY_L signals. For example, the filter circuit 552 provides a high level filtered DUTY_H signal when the DUTY_H signal is at the high level for greater time over a cycle than the DUTY_L signal. The filter circuit 554 provides a low level filtered DUTY_L signal when the DUTY_L signal is at the low level for greater time over the cycle than the DUTY_H signal. Conversely, the filter circuit 552 provides a low level filtered DUTY_H signal when the DUTY_H signal is at the low level for greater time over the cycle than the DUTY_L signal. The filter circuit 554 provides a high level filtered DUTY_L signal when the DUTY_L signal is at the high level for greater time over the cycle than the DUTY_H signal.

In FIG. 6, a cycle for the DUTY . . . H and DUTY . . . L signals is between times T0 and T2. The DUTY_H signal is at the high level for less time between times T0 and T2 than the DUTY_L signal. As a result, the filter circuit 552 provides a low level filtered DUTY_H signal and the filter circuit 554 provides a high level filtered DUTY_L signal.

The output of the amplifier circuit 560 is based on the levels of the filtered DUTY_H and DUTY_L signals. The amplifier circuit 560 provides a high level Phase1_UPDNB signal when the DUTY_H signal is at the high level and the DUTY_L signal is at a low level. The amplifier circuit 560 provides a low level Phase1_UPDNB signal when the DUTY_H signal is at the low level and the DUTY_L signal is at the high level. In the present example described with reference to FIG. 6, the amplifier circuit 560 provides a low level Phase1_UPDNB signal.

Figure 7:
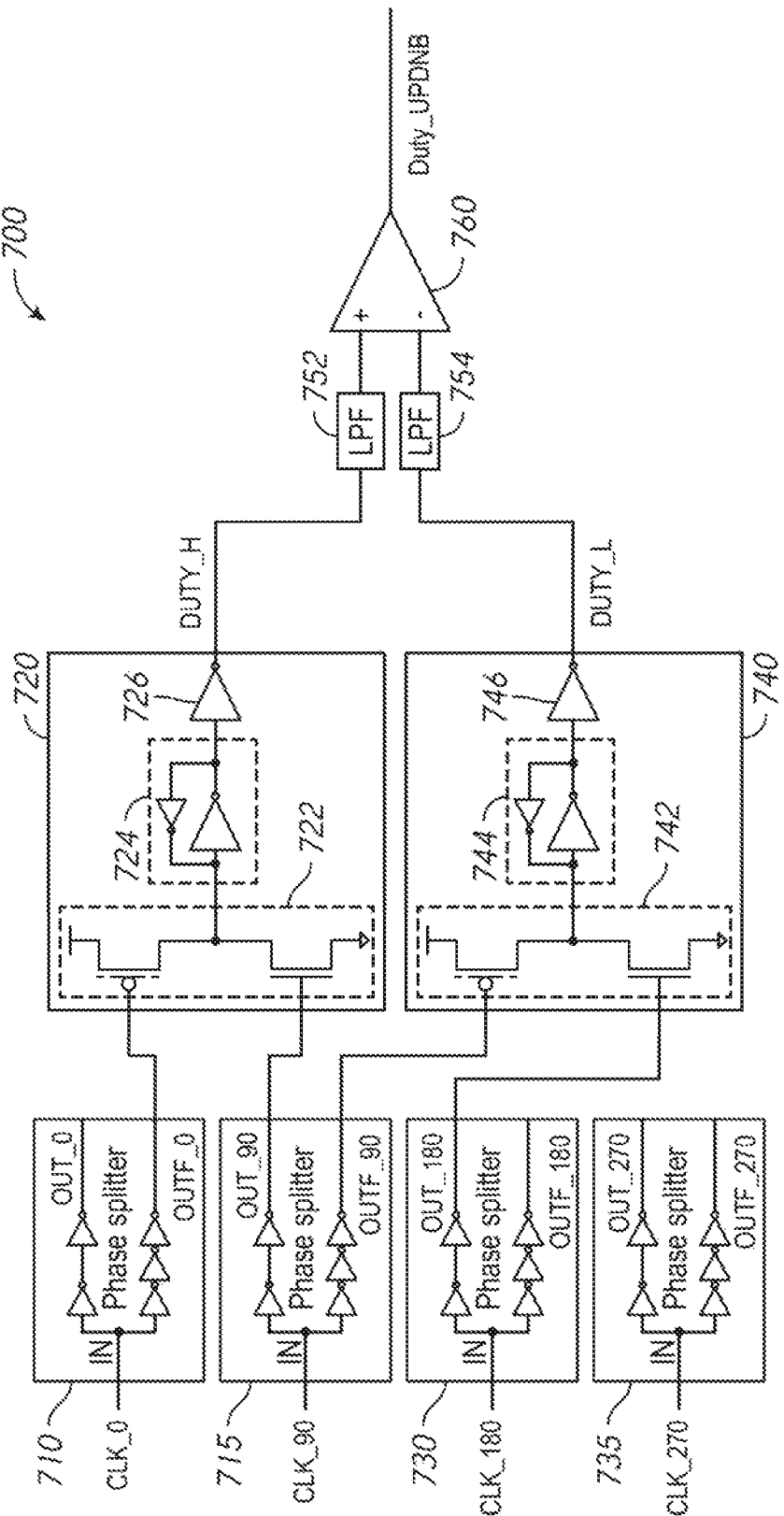
FIG. 7 is a schematic diagram of a detector circuit according to an embodiment of the disclosure.

FIG. 7 is a schematic diagram of a detector circuit 700 according to an embodiment of the disclosure. The detector circuit 700 may be included in the detector circuit 268 of FIG. 2 in some embodiments of the disclosure.

The detector circuit 700 includes phase splitter circuits 710, 715, 720, and 725. Each phase splitter circuit receives a respective input signal and provides two output signals. In particular, the phase splitter circuit 710 receives a CLK_0 signal and provides output signals OUT_0 and OUTF_0, the phase splitter circuit 715 receives a CLK_90 signal and provides output signals OUT_90 and OUTF_90, the phase splitter circuit 730 receives a CLK_180 signal and provides output signals OUT_180 and OUTF_180, and the phase splitter circuit 735 receives a CLK_270 signal and provides output signals OUT_270 and OUTF_270. The phase splitter circuit 735 is optional and may not be included in some embodiments of the disclosure. The phase splitter circuit 735 may be included to balance loading of a signal line provided in the CLK_270 signal with the loading of the signal lines providing the CLK_0, CLK_90, and CLK_180 signals due to the phase splitter circuits 710, 715, and 730. The output signal OUT has the same signal level as the input signal CLK and the output signal OUTF has the complementary signal level to the input signal CLK. For example, when the input signal CLK has a high level, the OUT signal has a high level and the OUTF signal has a low level; and when the input signal CLK has a low level, the OUT signal has a low level and the OUTF signal has a high level. Each phase splitter includes first and second signal paths. The first signal path includes two series-coupled inverter circuits and provides the OUT signal and the second signal path includes three series-coupled inverter circuits and provides the OUTF signal.

The detector circuit 700 further includes a phase detect circuit 720 and a phase detect circuit 740. The phase detect circuit 720 is provided with the OUTF_0 and OUT_90 signals and provides an output signal DUTY_H indicative of a phase relationship between the OUTF_0 and OUT_90 signals. The phase detect circuit 740 is provided with the OUTF_90 and OUT_180 signals and provides an output signal DUTY_L indicative of a phase relationship between the OUTF_90 and OUT_180 signals.

The phase detect circuit 720 includes an inverter 722 having a pull-up transistor controlled by the OUTF_0 signal and a pull-down transistor controlled by the OUT_90 signal. An output of the inverter circuit 722 is coupled to a latch circuit 724. The latch circuit 724 is a weak latch that holds a logic level of the inverter circuit 722 when the pull-up and pull-down transistors are not active. An output of the latch circuit 724 is coupled to an inverter circuit 726, which provides the DUTY_H signal. The phase detect circuit 740 includes an inverter 742 having a pull-up transistor controlled by the OUTF_90 signal and a pull-down transistor controlled by the OUT_180 signal. An output of the inverter circuit 742 is coupled to a latch circuit 744. The latch circuit 744 is a weak latch that holds a logic level of the inverter circuit 742 when the pull-up and pull-down transistors are not active. An output of the latch circuit 744 is coupled to an inverter circuit 746, which provides the DUTY_L signal.

The DUTY_H signal is provided to a filter circuit 752 and the DUTY_L signal is provided to a filter circuit 754. The filter circuits 752 and 754 filter high-frequency changes of the DUTY_H and DUTY_L signals, respectively. The filtered DUTY_H and DUTY_L signals are provided to an amplifier circuit 760 that provides an output signal Duty_UPDNB based on the levels of the filtered DUTY_H and DUTY_L signals.

In embodiments of the disclosure where the detector circuit 700 is included in the detector circuit 268 of FIG. 2, the CLK_0 signal may be the ICLK0 signal, the CLK_90 signal may be the ICLK90 signal, the CLK . . . 180 signal may be the ICLK180, and the CLK_270 signal may be the ICLK270 signal, and the Duty_UPDNB signal may be the Duty_UPDNB provided by the detector circuit 268.

In operation, rising edges of the CLK_0 signal cause the DUTY_H signal to change to a high level and rising edges of the CLK_90 cause the DUTY_H signal to change to a low level. Rising edges of the CLK_90 signal also cause the DUTY_L signal to change to a high level, and rising edges of the CLK_180 signal cause the DUTY_L signal to change to a low level. The time the DUTY_H signal is at a high level reflects the skew between the CLK_0 and CLK_90 signals. The time the DUTY_L signal is at a high level reflects the skew between the CLK090 and CLK_180 signals.

The filter circuits 752 and 754 remove changes in the levels for the DUTY_H and DUTY_L signals that are less than half the cycle of the DUTY_H and DUTY_L signals. For example, the filter circuit 752 provides a high level filtered DUTY_H signal when the DUTY_H signal is at the high level for greater time over a cycle than the DUTY_L signal. The filter circuit 754 provides a low level filtered DUTY_L signal when the DUTY_L signal is at the low level for greater time over the cycle than the DUTY_H signal. Conversely, the filter circuit 752 provides a low level filtered DUTY_H signal when the DUTY_H signal is at the low level for greater time over the cycle than the DUTY_L signal. The filter circuit 754 provides a high level filtered DUTY_L signal when the DUTY_L signal is at the high level for greater time over the cycle than the DUTY_H signal.

The output of the amplifier circuit 760 is based on the levels of the filtered DUTY_H and DUTY_L signals. The amplifier circuit 760 provides a high level Duty_UPDNB signal when the DUTY_H signal is at the high level and the DUTY_L signal is at the low level (e.g., the DUTY_H signal is a high level for greater time over a cycle than the DUTY_L signal). The amplifier circuit 760 provides a low level Duty_UPDNB signal when the DUTY_H signal is at the high level and the DUTY_L signal is at the low level (e.g., the DUTY_H signal is a high level for less time over a cycle than the DUTY_L signal).

For example, where the skew between the CLK_0 and CLK_90 signals is greater than the skew of the CLK_90 and CLK180 signals the Duty_UPDNB signal is a high level. Such a situation was described in the example of FIG. 3. As previously described, delay is added to the ICLK0 and ICLK180 signals so that rising edges of the ICLK90 signal are halfway between rising edges of the ICLK0 and ICLK180 signals, thereby removing any duty cycle error between the ICLK0, ICLK90, ICLK180, and ICLK270 signals. Where the skew between the CLK_90 and CLK_180 signals is greater than the skew of the CLK_0 and CLK_90 signals the Duty_UPDNB signal is a low level. The timing of the ICLK90 and ICLK270 signals may be adjusted, for example, to remove any duty cycle error between the ICLK0, ICLK90, ICLK180, and ICLK270 signals.

Figure 8:
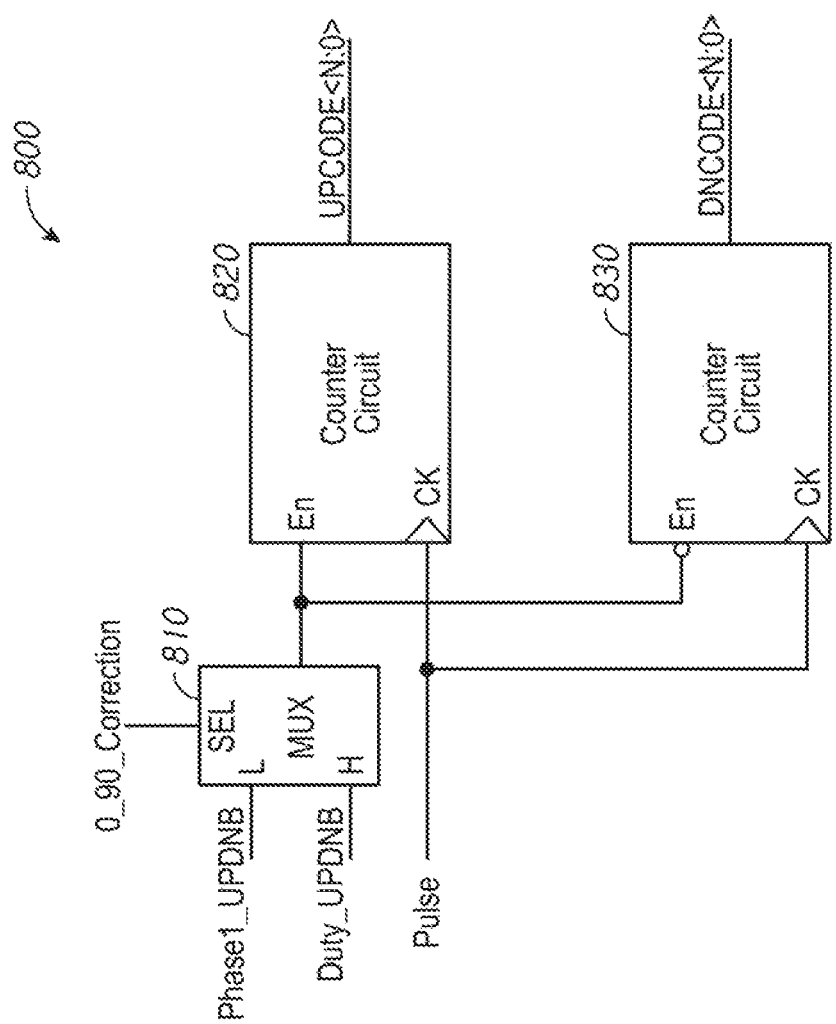
FIG. 8 is a block diagram of a code circuit according to an embodiment of the disclosure.

FIG. 8 is a block diagram of a code circuit 800 according to an embodiment of the disclosure. The code circuit 800 may be included in the code circuit 274 and/or 284 of FIG. 2 in some embodiments of the disclosure.

The code circuit 800 includes a multiplexer circuit 810 that receives a Phase1_UPDNB signal and a Duty_UPDNB signal, and further receives a control signal 0_90_Correction. The multiplexer 810 provides the Phase1_UPDNB or Duty_UPDNB signal based on the 0_90_Correction signal. For example, the multiplexer circuit 810 provides the Phase1_UPDNB signal when the 0_90_Correction signal is at a low level and provides the Duty_UPDNB signal when the 0_90_Correction signal is at a high level.

The output of the multiplexer circuit 810 is provided as an input to the counter circuit 820 and counter circuit 830. A control signal Pulse is also provided to clock the counter circuits 820 and 830. When the Pulse signal is active (e.g., active high pulse), the counter circuit 820 is clocked and a count value is incremented when the counter circuit 820 is activated by the output of the multiplexer circuit 810. Likewise, an active Pulse signal clocks the counter circuit 830 to increment a count value when the counter circuit 830 is activated by the output of the multiplexer circuit 810. For example, the counter circuit 820 increments its count value when the Pulse signal pulses and the counter circuit 820 is activated by a high level output from the multiplexer circuit 810, and the counter circuit 830 increments its count value when the Pulse signal pulses and the counter circuit 830 is activated by a low level output from the multiplexer circuit 810 (due to the inverting input of the counter circuit 830). The count value of the counter circuit 820 is provided as an UPCODE<N:0> signal and the count value of the counter circuit 830 is provided as an DNCODE<N:0> signal.

In embodiments of the disclosure where the code circuit 800 is included in the code circuit 274, the Phase1_UPDNB signal may be the Phase1_UPDNB_0_180 signal provided by the detector circuit 262 and the Duty_UPDNB signal may be provided by the detector circuit 268. In embodiments of the disclosure where the code circuit 800 is included in the code circuit 284, the Phase1_UPDNB signal may be the Phase1_UPDNB_90_270 signal provided by the detector circuit 264 and the Duty_UPDNB signal may be provided by the detector circuit 268. The Pulse signal and 0_90_Correction signal may be provided to the code circuit 800 as shown in FIG. 2 for the code circuits 274 and 284.

While the counter circuits 820 and 830 have been described as incrementing the respective count values, in some embodiments of the disclosure, the counter circuits 830 may decrement the respective count value based on the output of the multiplexer circuit 810 and the Pulse signal.

Figure 9:
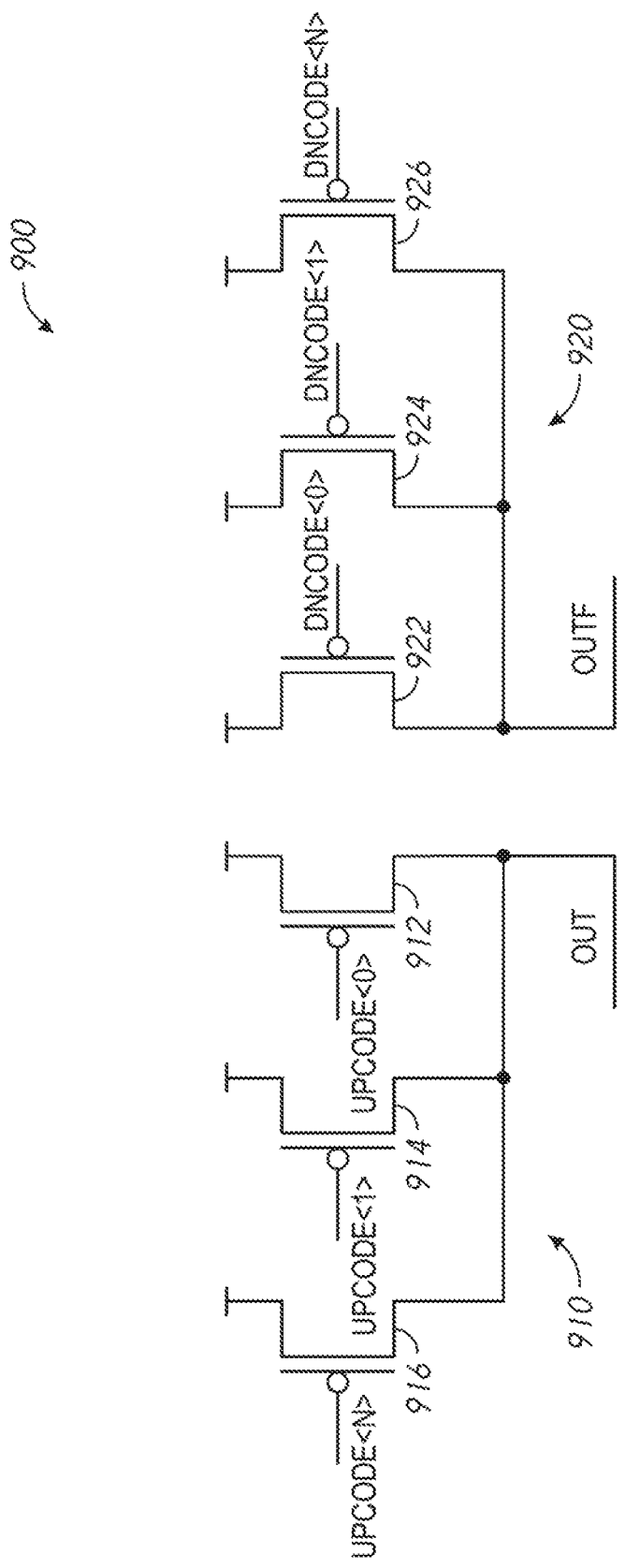
FIG. 9 is a schematic diagram of a timing adjustment circuit according to an embodiment of the disclosure.

FIG. 9 is a schematic diagram of a timing adjustment circuit 900 according to an embodiment of the disclosure. The timing adjustment circuit 900 may be included in the timing adjustment circuit 278 and/or timing adjustment circuit 288 of FIG. 2.

The timing adjustment circuit 900 includes current circuit 910 and current circuit 920. The current circuit 910 includes a plurality of transistors 912, 914, and 916, the activation of which are controlled by UPCODE<N:0> signals, and the current circuit 920 includes a plurality of transistors 922, 924, and 926, the activation of which are controlled by DNCODE<N:0> signals. In the embodiment shown in FIG. 9, the transistors are activated when the respective UPCODE or DNCODE signal is a low level.

The current circuits 910 and 920 are each shown as including N transistors, where N is a whole number. In the embodiment of FIG. 9, three transistors are shown for each of the current circuits 910 and 920. However, in other embodiments, greater or fewer transistors may be included. In the embodiment shown in FIG. 9, the transistors 912, 914, 916, 922, 924, and 926 are shown as p-type transistors. However, in other embodiments, other examples of transistors may be used.

With reference to the current circuit 910, the current OUT provided by the current circuit 910 has a magnitude that may be adjusted based on the UPCODE<N:0> signals. The current provided by the current circuit 910 may be increased by activating more of the transistors 912, 914, and 916, and the current decreased by activating less of the transistors 912, 914, and 916. For example, assuming that the transistor 912 is activated by a low level UPCODE<0> signal, current may be increased by activating the transistor 914 with a low level UPCODE<1> signal, and current may further be increased by activating the transistor 916 with a low level UPCODE<N> signal. Current may be decreased by changing one or more of the UPCODE signals to a high level to deactivate the respective transistor.

With reference to the current circuit 920, the current OUTF provided by the current circuit 920 has a magnitude that may be adjusted based on the DNCODE<N:0> signals. The current provided by the current circuit 920 may be increased by activating more of the transistors 922, 924, and 926, and the current decreased by activating less of the transistors 922, 924, and 926. For example, assuming that the transistor 922 is activated by a low level DNCODE<0> signal, current may be increased by activating the transistor 924 with a low level DNCODE<1> signal, and current may further be increased by activating the transistor 926 with a low level DNCODE<N> signal. Current may be decreased by changing one or more of the DNCODE signals to a high level to deactivate the respective transistor.

In some embodiments of the disclosure, the OUT and OUTF currents provided by the timing adjustment circuit 900 may be used to adjust the timing of signals provided on signal lines to which the current circuits 910 and 920 are coupled. Increasing the currents provided to the signal line providing a signal may change the rate at which the signal changes from one level to another. As will be described in greater detail below, changing the rate at which a signal changes from one level to another may adjust the timing of the signal.

The currents OUT and OUTF provided by the current circuits 910 and 920 may be provided as the adjustment signals, for example, to a signal driver circuit. In embodiments of the disclosure where the timing adjustment circuit 900 is included in the timing adjustment circuit 278 and/or timing adjustment circuit 288 of FIG. 2, the currents OUT and OUTF provided by the current circuits 910 and 920 may represent the ADJ_0_180 signals and the currents OUT and OUTF provided by the current circuits 910 and 920 may represent the ADJ_90_270 signals.

Figure 10:
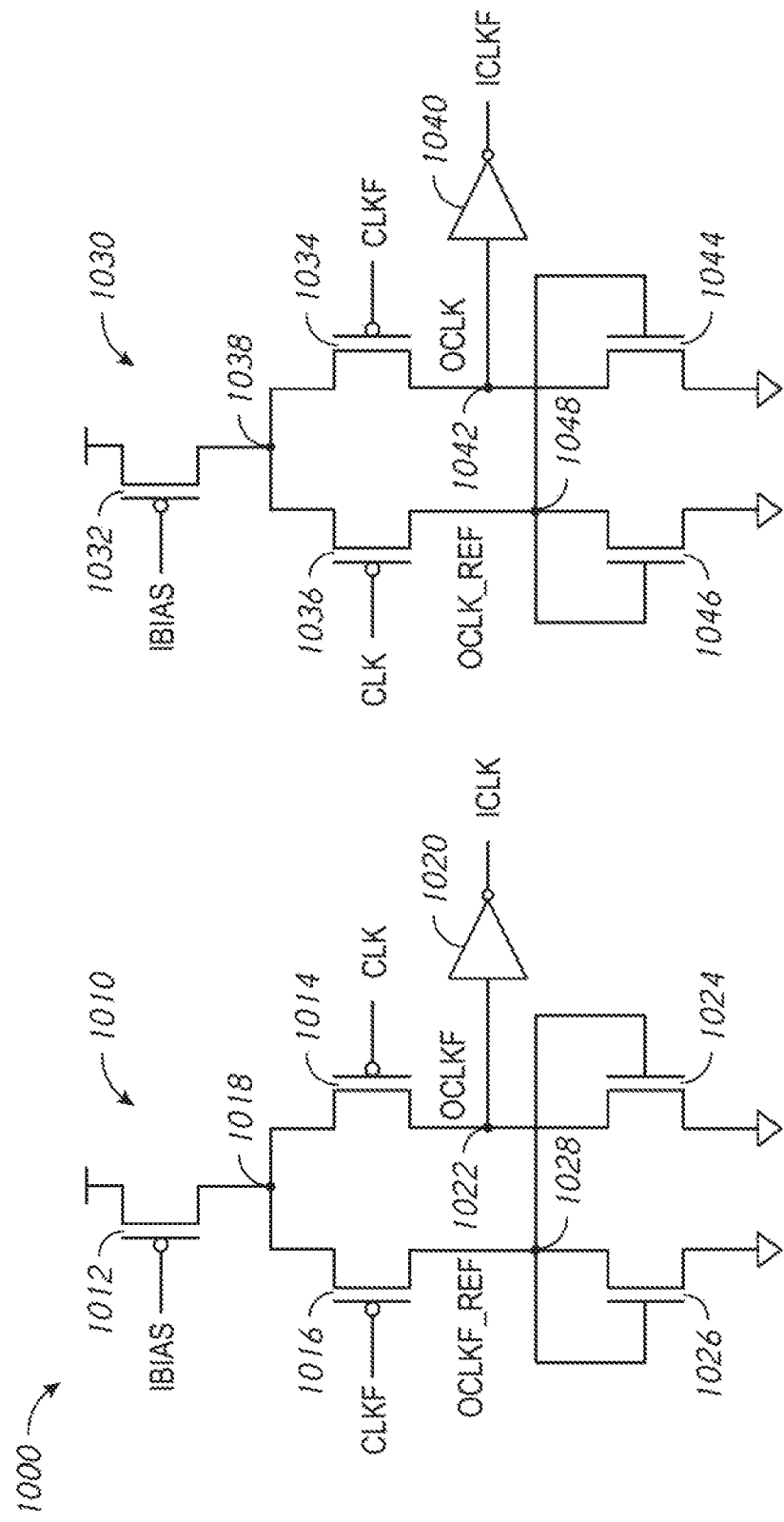
FIG. 10 is a schematic diagram of a level shifter circuit according to an embodiment of the disclosure.

FIG. 10 is a schematic diagram of a level shifter circuit 1000 according to an embodiment of the disclosure. The level shifter circuit 1000 may be included in the level shifter circuit 236 and/or level shifter circuit 238 of FIG. 2 in some embodiments of the disclosure.

The level shifter circuit 1000 includes level shifter stage 1010 and level shifter stage 1030. Each level shifter stage 1010 and 1020 provides a respective output signal ICLK and ICLKF. The level shifter stage 1010 includes series coupled p-type and n-type transistors 1014 and 1024 coupled between a node 1018 and a reference voltage (e.g., ground), and further includes series coupled p-type and n-type transistors 1016 and 1026 coupled between the node 1018 and the reference voltage. A p-type bias transistor 1012 coupled to a power supply and the node 1018 provides power to the node 1018 based on a bias signal IBIAS. A gate of the transistor 1014 is provided a clock signal CLK and a gate of the transistor 1016 is provided a clock signal CLKF. The CLK and CLKF are complementary clock signals. Gates of the transistors 1024 and 1026 are coupled together, and to a node 1028. An inverter 1020 is coupled to a node 1022 and provides the ICLK signal that is the complement of a signal OCLKF at the node 1022.

The level shifter stage 1030 includes series coupled p-type and n-type transistors 1034 and 1044 coupled between a node 1038 and the reference voltage, and further includes series coupled p-type and n-type transistors 1036 and 1046 coupled between the node 1038 and the reference voltage. A p-type bias transistor 1032 coupled to the power supply and the node 1038 provides power to the node 1038 based on the IBIAS signal. A gate of the transistor 1034 is provided the CLKF signal and a gate of the transistor 1036 is provided the CLK signal. Gates of the transistors 1044 and 1046 are coupled together, and to a node 1048. An inverter 1040 is coupled to a node 1042 and provides the ICLKF signal that is the complement of a signal OCLK at the node 1042.

In operation, the level shifter stage 1010 provides the ICLK signal having a level complementary to the OCLKF signal at the node 1022, relative to an OCLKF_REF voltage at the node 1028. For example, when the OCLKF signal is greater than the OCLKF_REF voltage, the inverter 1020 is triggered to provide a low level ICLK signal, and when the OCLKF signal is less than the OCLKF_REF voltage, the inverter 1020 is triggered to provide a high level ICLK signal. The voltage of the OCLKF signal is based on the CLK signal provided to the gate of the transistor 1014 and the CLKF signal provided to the gate of the transistor 1016.

The timing of the ICLK signal may be adjusted by the rates at which the CLK and/or CLKF signals change from one level to another. For example, as previously described, the inverter 1020 is triggered to provide a low level ICLK signal when the OCLKF signal exceeds the OCLKF_REF voltage. The rate at which the OCLKF signal changes from a low level to exceed the OCLKF_REF signal is based on the rate at which the CLK signal changes from a high level to a low level and/or the rate at which the CLKF signal changes from a low level to a high level. Where the rate at which the CLK signal changes from a high level to a low level is decreased (e.g., slower fall time), the rate at which the OCLKF signal changes from a low level to a high level is also decreased (e.g., slower rise time). Consequently, the OCLKF signal exceeds the OCLKF_REF voltage at a relatively later time, thereby causing the inverter 1020 to be triggered to provide the low level ICLK signal at a relatively later time. As a result, the timing of the ICLK signal changing from a high level to a low level is relatively delayed. Conversely, where the rate of change of the CLK signal changing from a high level to a low level is increased (e.g., faster fall time), the rate at which the OCLKF signal changes from a low level to a high level is also increased (e.g., faster rise time). Consequently, the OCLKF signal exceeds the OCLKF_REF voltage at a relatively earlier time, thereby causing the inverter 1020 to be triggered to provide the low level ICLK signal at a relatively earlier time. As a result, the timing of the ICLK signal changing from a high level to a low level is relatively earlier (e.g., relatively less delay).

In operation, the level shifter stage 1030 provides the ICLKF signal having a level complementary to the OCLK signal at the node 1042, relative to an OCLK_REF voltage at the node 1048. For example, when the OCLK signal is greater than the OCLK_REF voltage, the inverter 1040 is triggered to provide a low level ICLKF signal, and when the OCLK signal is less than the OCLK_REF voltage, the inverter 1040 is triggered to provide a high level ICLKF signal. The voltage of the OCLK signal is based on the CLKF signal provided to the gate of the transistor 1034 and the CLK signal provided to the gate of the transistor 1036.

The timing of the ICLKF signal may be adjusted by the rate at which the CLK and CLKF signals change from one level to another. For example, as previously described, the inverter 1040 is triggered to provide a high level ICLKF signal when the OCLK signal is less than the OCLK_REF voltage. The rate at which the OCLK signal changes from a high level to less than the OCLK_REF signal may be based on the rate at which the CLK signal changes from a high level to a low level and/or the rate at which the CLKF signal changes from a low level to a high level. Where the rate at which the CLK signal changes from a high level to a low level is decreased (e.g., slower fall time), the rate at which the OCLK signal changes from a high level to a low level is also decreased (e.g., slower fall time). The rate at which the OCLK signal changes from a high level to a low level decreases because the decreasing CLK signal reduces the current at the node 1042, and as a result, the voltage at the node 1042 decreases more slowly. Consequently, the OCLK signal becomes less than the OCLK_REF voltage at a relatively later time, thereby causing the inverter 1040 to be triggered to provide the high level ICLKF signal at a relatively later time. As a result, the timing of the ICLKF signal changing from a low level to a high level is relatively delayed. Conversely, where the rate at which the CLK signal changing from a high level to a low level is increased (e.g., faster fall time), the rate at which the OCLK signal changes from a high level to a low level is also increased (e.g., faster fall time). Consequently, the OCLK signal becomes less than the OCLK_REF voltage at a relatively earlier time, thereby causing the inverter 1040 to be triggered to provide the high level ICLKF signal at a relatively earlier time. As a result, the timing of the ICLKF signal changing from a low level to a high level is relatively earlier (e.g., relatively less delay).

The previous description for adjusting the timing of a low level ICLK signal using the level shifter stage 1010 may be generally applied to adjusting the timing of a low level ICLKF signal using the level shifter stage 1030. Likewise, the previous description for adjusting the timing of a high level ICLKF signal using the level shifter stage 1030 may be generally applied to adjusting the timing of a high level ICLK signal using the level shifter stage 1010. Additionally, the timing for the ICLK and ICLKF signals may be adjusted by changing the rate at which the CLKF signal changes from a low level to a high level and/or the rate at which the CLKF signal changes from a high level to a low level.

In embodiments of the disclosure where the level shifter circuit 1000 is include in the level shifter circuit 236, the CLK signal may be the CLK0' signal and the CLKF signal may be the CLK180' signal, and the ICLK signal may be the ICLK0 signal and the ICLKF signal may be the ICLK180 signal. In embodiments of the disclosure where the level shifter circuit 1000 is include in the level shifter circuit 238, the CLK signal may be the CLK90' signal and the CLKF signal may be the CLK270' signal, and the ICLK signal may be the ICLK90 signal and the ICLKF signal may be the ICLK270 signal.

The rate the CLK and CLKF signals change from one level to another may be adjusted by changing current on the signal line providing the CLK or CLKF signal. Increasing or decreasing current causes the CLK or CLKF signal to change from one level to another at different rates. For example, in some embodiments of the disclosure, the ADJ_0_180 signals and the ADJ_90_270 signals provided by the timing adjustment circuits 278 and 288 to the signal driver circuit 230 of FIG. 2 may be current signals having magnitudes based on the UPCODE0 and DNCODE0 signals and the UPCODE1 and DNCODE1 signals. Thus, the timing adjustment circuits 278 and 288 provide currents that adjust the rate at which the CLK0' and CLK180' signals and the CLK90' and CLK270' signals change levels. Where the level shifter circuit 1000 is included in the level shifter circuits 236 and 238, adjusting the rate the CLK0' and CLK180' signals and the CLK90' and CLK270' signals change levels may change the timing of the resulting ICLK0, ICLK90, ICLK180, and ICLK270 signals as previously described.

Figure 11:
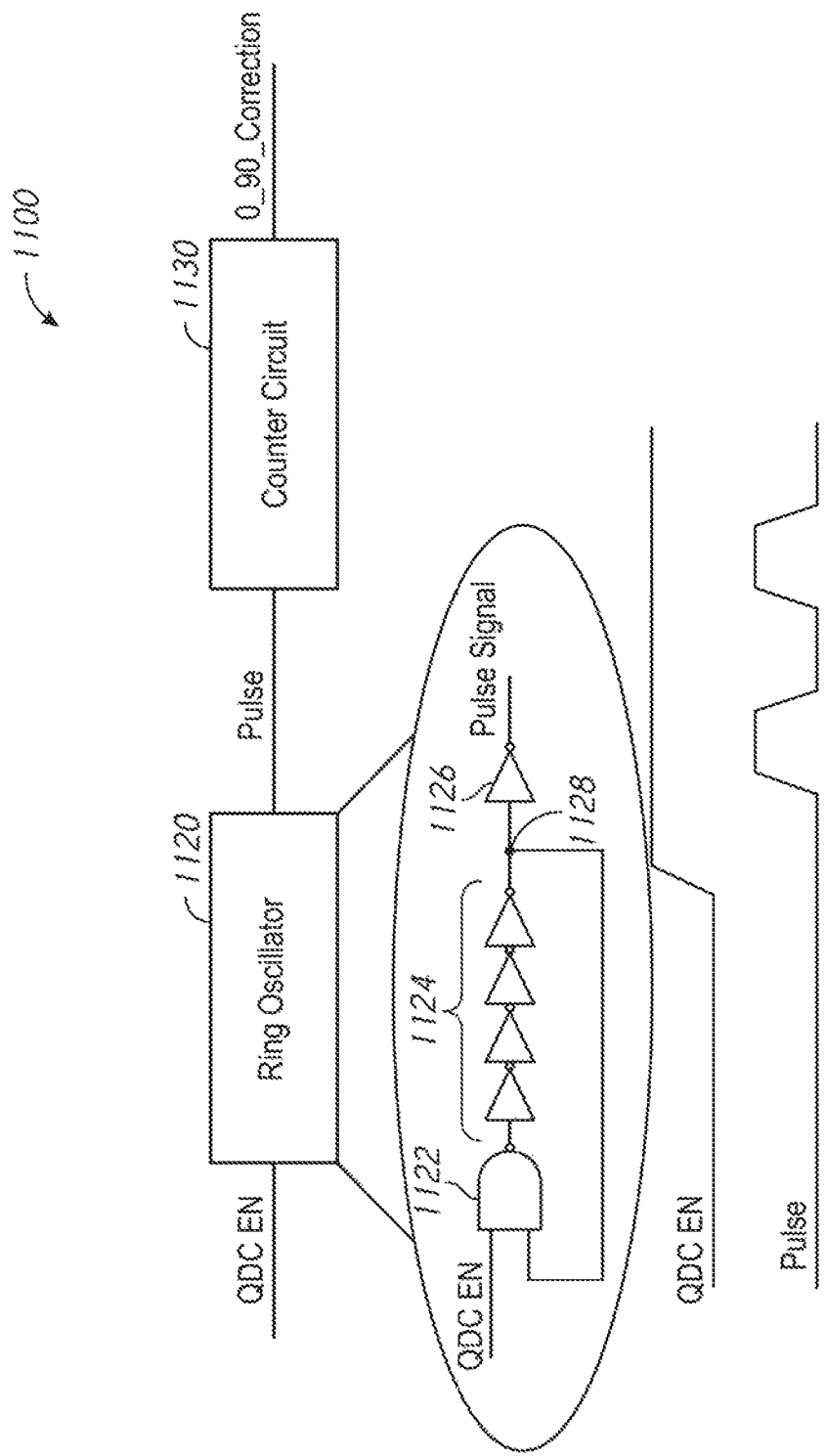
FIG. 11 is a block diagram of a control circuit according to an embodiment of the disclosure.

FIG. 11 is a block diagram of a control circuit 1100 according to an embodiment of the disclosure. The control circuit 1100 provides a control signal Pulse and a control signal 0_90_Correction based on an enable signal QDC_EN. In some embodiments of the disclosure, the control circuit 1100 may provide the Pulse signal and 0_90_Correction signal to the clock circuit 200 of FIG. 2.

The control circuit 1100 includes a ring oscillator 1120 that receives the QDC EN signal. The QDC EN signal may be provided by a command decoder, for example, the command decoder 115 of FIG. 1. An active QDC EN signal (e.g., active high level) is provided when duty cycle correction according to an embodiment of the disclosure as described herein is to be performed. An active QDC EN signal may be provided, for example, when a device including the clock circuit 200 and the control circuit 1100 are initialized, such as a power on sequence or when the device is reset.

The ring oscillator 1120 includes a logic gate 1122 and series coupled inverter circuits 1124. The logic gate 1122 is provided the QDC EN signal and further provided an output from a last inverter circuit of the series coupled inverter circuits 1124 at node 1128. The output of the last inverter circuit of the series coupled inverter circuits 1124 at node 1128 is also provided to an inverter circuit 1126. The inverter circuit 1126 provides the Pulse signal.

When the QDC EN signal is inactive (e.g., inactive low level), the ring oscillator 1120 provides a Pulse signal having a low level. However, when activated by an active QDC EN signal, the ring oscillator 1120 provides a Pulse signal that periodically pulses from a low level to a high level, before returning to a low level. The logic gate 1122 provides the complementary level from node 1128 when an active QDC EN signal is provided to the ring oscillator 1120. The odd number of inverting circuits formed in a ring from the input of the logic gate 1122 to the node 28 cause the level at the node 28 to oscillate (e.g., switch between low and high levels periodically). The frequency of the pulses is based on a propagation delay through the logic gate 1122, the series coupled inverter circuits 1124, and the inverter circuit 1126. FIG. 11 shows the operation of the ring oscillator 1120 according to an embodiment of the disclosure. In particular, following the QDC EN signal becoming active, the Pulse signal pulses to the high level periodically. The ring oscillator continues to provide the periodic pulses until deactivated by an inactive QDC EN signal.

The Pulse signal is provided to a counter circuit 1130. The counter circuit 1130 counts based on the Pulse signal, and provides the 0_90_Correction signal based on a count value. For example, the counter circuit 1130 may increment every time the Pulse signal pulses. When the count value reaches a threshold value, the counter circuit 1130 provides the 0_90_Correction signal having a level that is different than when the count value is less than the threshold value. In some embodiments of the disclosure, the threshold count value is seven. When the count value of the counter circuit 1130 is less than seven, the 0_90_Correction signal may be a low level. However, when the count value of the counter circuit 1130 reaches seven, the counter circuit 1130 provides a high level 0_90_Correction signal.

As previously described, the 0_90_Correction signal may be low while clock period error is detected and corrected, and may be high while duty cycle error is detected and corrected in some embodiments of the disclosure.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
    a duty cycle correction circuit configured to receive multiphase clock signals and configured to detect a first clock period error between a first two complementary clock signals of the multiphase clock signals and to detect a second clock period error between a second two complementary clock signals of the multiphase clock signals, the duty cycle correction circuit further configured to detect a duty cycle error between the multiphase clock signals and to provide first adjustment signals based on the first clock period error and the duty cycle error and provide second adjustment signals based on the second clock period error and the duty cycle error; and
    a signal driver circuit configured to receive the first and second adjustment signals and configured to adjust the timing of one of the first two complementary clock signals, adjust the timing of one of the second two complementary clock signals, and adjust the timing of the first two complementary clock signals relative to the second two complementary clock signals based on the first and second adjustment signals to provide duty cycle corrected multiphase clock signals.

2. The apparatus of claim 1 wherein the signal driver circuit is configured to adjust the timing of the timing of the first two complementary clock signals and the second two complementary clock signals by adjusting a rate at which the clock signals change from one level to another based on the first and second adjustment signals.

3. The apparatus of claim 2 wherein the first and second adjustment signals comprise first and second current signals, respectively, a magnitude of the first current signal based on the first adjustment signals and a magnitude of the second current signal based on the second adjustment signals.

4. The apparatus of claim 1 wherein the duty cycle correction circuit is configured to provide first and second adjustment signals that cause the signal driver circuit to add or subtract delay to the first and second two complementary clock signals to adjust the timing.

5. The apparatus of claim 1 wherein the duty cycle correction circuit is configured to provide the first adjustment signals to cause the signal driver circuit to adjust the timing of one of the first two complementary clock signals to correct the first clock period error and to provide the second adjustment signals to cause the signal driver circuit to adjust the timing of one of the second two complementary clock signals to correct the second clock period error, and further configured to then provide the first and second adjustment signals to cause the signal driver circuit to adjust the timing of the first two complementary clock signals or to adjust the timing of the second two complementary clock signals to correct the duty cycle error.

6. The apparatus of claim 1 wherein the multiphase clock signals comprise quadrature clock signals.

7. The apparatus of claim 1, further comprising an input/output circuit configured to receive the multiphase clock signals and configured to provide data responsive to the multiphase clock signals.

8. An apparatus, comprising:
a duty cycle correction circuit configured to detect a period error of first complementary clock signals and configured to provide first control signals to change a timing of the first complementary clock signals relative to one another and configured to detect a period error of second complementary clock signals and provide second control signals to change a timing of the second complementary clock signals relative to one another, the duty cycle correction circuit further configured to detect duty error between the first complementary clock signals and second complementary clock signals and provide the first and second control signals to change timing of the first complementary clock signals and second complementary clock signals relative to one another; and
a signal driver configured to change a timing of signal transitions of one or more of the first and second complementary clock signals based on the first and second control signals.

9. The apparatus of claim 8 wherein the signal driver comprises:
first repeater circuits configured to drive the first complementary clock signals;
second repeater circuits configured to drive the second complementary clock signals;
a first level shifter circuit configured to receive the first complementary clock signals and provide level shifted first complementary clock signals; and
a second level shifter circuit configured to receive the second complementary clock signals and provide level shifted second complementary clock signals.

10. The apparatus of claim 9 wherein the first and second repeater circuits are configured to drive the respective signals to a common mode logic level and wherein the first and second level shifter circuits are configured to change the level of the respective signals from the common mode logic level to CMOS level.

11. The apparatus of claim 8 wherein the duty cycle correction circuit is configured to provide respective current signals as the first and second control signals, the respective current signal having magnitudes based on the period error in the first complementary clock signals or the period error in the second complementary clock signals.

12. The apparatus of claim 8 wherein the duty cycle correction circuit comprises:
a duty cycle detector configured to detect the period error of the first complementary clock signals, detect the period error of the second complementary clock signals, and detect the duty error between the first complementary clock signals and the second complementary clock signals;
a first duty cycle adjustment circuit configured to provide the first control signals based on the period error of the first complementary clock signals and the duty error between the first complementary clock signals and the second complementary clock signals; and
a second duty cycle adjustment circuit configured provide the second control signals based on the period error of the second complementary clock signals and the duty error between the first complementary clock signals and the second complementary clock signals.

13. The apparatus of claim 12 wherein the duty cycle detector is configured to provide a duty control signal based on the duty error, and provide a first phase control signal based on the period error of the first complementary clock signals and provide a second phase control signal based on the period error of the second complementary clock signals, wherein the first phase control signal and the duty control signal is provided to the first duty cycle adjustment circuit and the second phase control signal and the duty control signal is provided to the second duty cycle adjustment circuit.

14. A method, comprising:
detecting a first clock period error between a first two complementary clock signals of multiphase clock signals;
detecting a second clock period error between a second two complementary clock signals of the multiphase clock signals, detecting a duty cycle error between the multiphase clock signals;
providing first adjustment signals based on the first clock period error and the duty cycle error between the multiphase clock signals;
providing second adjustment signals based on the second clock period error and the duty cycle error between the multiphase clock signals;
adjusting the timing of one of the first two complementary clock signals;
adjusting the timing of one of the second two complementary clock signals; and
adjusting the timing of the first two complementary clock signals relative to the second two complementary clock signals based on the first and second adjustment signals to provide duty cycle corrected multiphase clock signals.

15. The method of claim 14 wherein detecting the first clock period error between the first two complementary clock signals of the multiphase clock signals comprises detecting whether rising edges of one of the first two complementary clock signals are halfway between rising edges of another other one of the first two complementary clock signals.

16. The method of claim 14 wherein adjusting the timing of the one of the first two complementary clock signals comprises delaying the one of the first two complementary clock signals based on the first clock period error.

17. The method of claim 16 wherein delaying the one of the first two complementary clock signals comprises decreasing the rate at which the one of the first two complementary clock signals changes from one clock level to another.

18. The method of claim 14 wherein detecting the duty cycle error between the multiphase clock signals comprises detecting whether rising edges of one of the first two complementary clock signals are halfway between rising edges of the second two complementary clock signals of the multiphase clock signals.

19. The method of claim 14 wherein adjusting the timing of the first two complementary clock signals relative to the second two complementary clock signals comprises changing a rate at which the first two complementary clock signals or the second two complementary clock signals change from one clock level to another.

20. The method of claim 19 wherein changing the rate at which the first two complementary clock signals or the second two complementary clock signals change from one clock level to another comprises changing the signal transitions to be faster or slower.

* * * * *